(12) United States Patent
Kurasawa et al.

(10) Patent No.: US 6,974,985 B2
(45) Date of Patent: Dec. 13, 2005

(54) CAPACITOR AND METHOD FOR FABRICATING THE SAME, AND SEMICONDUCTOR DEVICE AND METHOD FOR FABRICATING THE SAME

(75) Inventors: Masaki Kurasawa, Kawasaki (JP); Kazuaki Kurihara, Kawasaki (JP); Kenji Maruyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/960,398

(22) Filed: Sep. 24, 2001

(65) Prior Publication Data
US 2002/0102791 A1   Aug. 1, 2002

(30) Foreign Application Priority Data
Jan. 31, 2001 (JP) .............................. 2001-022905

(51) Int. Cl.$^7$ ......................................... H01L 27/108
(52) U.S. Cl. ..................... 257/296; 257/311
(58) Field of Search ................ 257/295–296, 257/303–305, 311, 306, 308–309; 438/253–255, 438/396–398, 3

(56) References Cited

U.S. PATENT DOCUMENTS

| | | | |
|---|---|---|---|
| 5,478,610 A * | 12/1995 | Desu et al. ................. | 427/573 |
| 5,489,548 A * | 2/1996 | Nishioka et al. ............. | 438/396 |
| 5,619,393 A * | 4/1997 | Summerfelt et al. ...... | 361/321.1 |
| 5,719,417 A * | 2/1998 | Roeder et al. .............. | 257/295 |
| 5,796,573 A * | 8/1998 | Kotecki et al. ........... | 361/321.5 |
| 5,852,307 A * | 12/1998 | Aoyama et al. ............. | 257/295 |
| 5,882,410 A * | 3/1999 | Kawahara et al. .......... | 118/712 |
| 5,889,299 A * | 3/1999 | Abe et al. .................... | 257/295 |
| 5,892,254 A * | 4/1999 | Park et al. .................. | 257/295 |
| 5,998,236 A * | 12/1999 | Roeder et al. .............. | 438/104 |
| 6,043,526 A * | 3/2000 | Ochiai ......................... | 257/295 |
| 6,097,133 A * | 8/2000 | Shimada et al. ............ | 310/358 |
| 6,136,639 A * | 10/2000 | Seon ........................... | 438/239 |

(Continued)

FOREIGN PATENT DOCUMENTS

JP    HEI 06-151601 (A)    5/1994

(Continued)

OTHER PUBLICATIONS

Y. Sakashita et al., J, Appl. Phys. 69, 8352–8357 (1991) "Preparation and Electrical Properties of MOCVD-Deposited PZT Thin Films".

(Continued)

Primary Examiner—Long Pham
Assistant Examiner—Thao X. Le
(74) Attorney, Agent, or Firm—Westerman, Hattori, Daniels & Adrian, LLP

(57) ABSTRACT

The semiconductor device comprises: a memory cell transistor formed on a semiconductor substrate 10; insulation films 22, 30 covering the memory cell transistor; a buffer structure 40 formed on the insulation film; and a capacitor including a lower electrode 42 formed on the buffer structure 40 and electrically connected to the source/drain diffused layer 20; a capacitor dielectric film 44 formed on the lower electrode 42, and formed of a perovskite ferroelectric material having a smaller thermal expansion coefficient than that of the buffer structure 40 and having a crystal oriented substantially perpendicular to a surface of the lower electrode 42. The buffer structure for mitigating the influence of the stress from the substrate is formed below the lower electrode, whereby a polarization direction of the capacitor dielectric film can be made parallel with a direction of an electric field applied between the upper electrode and the lower electrode. An intrinsic polarization of the ferroelectric film can be utilized as it is.

10 Claims, 22 Drawing Sheets

U.S. PATENT DOCUMENTS

| | | | |
|---|---|---|---|
| 6,156,599 A * | 12/2000 | Aoyama et al. | 438/238 |
| 6,156,623 A * | 12/2000 | Hendrix et al. | 438/457 |
| 6,180,446 B1 * | 1/2001 | Crenshaw et al. | 438/240 |
| 6,184,074 B1 * | 2/2001 | Crenshaw et al. | 438/238 |
| 6,194,818 B1 * | 2/2001 | Sumi et al. | 1/1 |
| 6,198,208 B1 * | 3/2001 | Yano et al. | 310/358 |
| 6,249,016 B1 * | 6/2001 | Chaudhry et al. | 257/296 |
| 6,258,459 B1 * | 7/2001 | Noguchi et al. | 117/944 |
| 6,265,230 B1 * | 7/2001 | Aggarwal et al. | 438/3 |
| 6,265,740 B1 * | 7/2001 | Kim | 257/296 |
| 6,274,899 B1 * | 8/2001 | Melnick et al. | 257/298 |
| 6,294,420 B1 * | 9/2001 | Tsu et al. | 438/239 |
| 6,294,860 B1 * | 9/2001 | Shimada et al. | 310/328 |
| 6,312,988 B1 * | 11/2001 | Lowrey et al. | 438/255 |
| 6,333,227 B1 * | 12/2001 | Kim et al. | 438/255 |
| 6,365,517 B1 * | 4/2002 | Lu et al. | 438/683 |
| 6,384,443 B1 * | 5/2002 | Tsunemine | 257/303 |
| 6,414,348 B1 * | 7/2002 | Cho et al. | 257/306 |
| 6,479,899 B1 * | 11/2002 | Fukuda et al. | 257/758 |
| 6,483,167 B1 * | 11/2002 | Nabatame et al. | 257/532 |
| 6,486,021 B2 * | 11/2002 | Kim et al. | 438/240 |
| 6,489,644 B1 * | 12/2002 | Seon | 257/295 |
| 6,559,495 B1 * | 5/2003 | Abiko | |
| 6,573,553 B2 * | 6/2003 | Nakamura | 257/309 |
| 2001/0002708 A1 * | 6/2001 | Nakamura | 257/295 |
| 2001/0015448 A1 * | 8/2001 | Kawakubo et al. | 257/296 |
| 2002/0063274 A1 * | 5/2002 | Kanaya et al. | 257/310 |

FOREIGN PATENT DOCUMENTS

| | | | |
|---|---|---|---|
| JP | HEI 06-151602 (A) | 5/1994 | |
| JP | 02000286396 | * 10/2000 | H01L 27/10 |
| JP | 02000286396 A | * 10/2000 | H01L 27/10 |

OTHER PUBLICATIONS

J.F.Scott et al., J. Appl. Phys. 70, 382-388 (1991) "Quantitative Measurement of Space-Charge Effects in Lead Zirconate-Titanate Memories".

M.H. Kim et al., J. Mater. Res. 14, 634-637 (1999) "Highly (200)-Oriented Pt Films on $SiO_2$/Si Substrates By Seed Selection Through Amorphization and Controlled Grain Growth".

* cited by examiner

PRIOR ART

CAPACITOR AND METHOD FOR FABRICATING THE SAME, AND SEMICONDUCTOR DEVICE AND METHOD FOR FABRICATING THE SAME

CROSS-REFERENCE TO RELATED APPLICATIONS

This application is based upon and claims priority of Japanese patent Application No. 2001-22905, filed in Jan. 31, 2001, the contents being incorporated herein by reference.

BACKGROUND OF THE INVENTION

The present invention relates to a capacitor and a method for fabricating the same and a semiconductor device, and a method for fabricating the same, more specifically to a ferroelectric capacitor having a ferroelectric film having an electric field application direction and a polarization axis which are parallel with each other, a method for fabricating the same and a semiconductor device having such the ferroelectric capacitor and a method for fabricating the same.

Ferroelectric materials, such as $SrTiO_3$, $Pb(Zr,Ti)O_3$, etc., have applications in various fields where their high dielectric constants and polarization inversion characteristics are utilized. An example of the applications utilizing their high dielectric constants is DRAM-type semiconductor memory devices comprising capacitors including a ferroelectric film as the dielectric film (ferroelectric capacitors), for storing informations in the capacitors as electric charges. An example of the applications utilizing polarization inversion characteristics is nonvolatile memory devices comprising ferroelectric capacitors, for storing in the capacitors informations corresponding to polarization directions of the ferroelectric film. Ferroelectric capacitors can have capacitor areas decreased by increasing capacitance values per unit area. Ferroelectric capacitors can form nonvolatile devices. Ferroelectric capacitors are very useful in semiconductor memory devices which are increasing micronized.

A conventional capacitor using ferroelectric film will be explained with reference to FIGS. 19A–19C. FIGS. 19A–19C are diagrammatic sectional views of the conventional capacitors.

As exemplified in FIG. 19A, the conventional capacitor comprises a lower electrode 100 of, e.g., platinum, a ferroelectric film 102 of, e.g., $Pb(Zr,Ti)O_3$ (hereinafter called PZT), and an upper electrode 104 of, e.g., platinum which are laid on another.

Usually, the platinum film as the lower electrode 100 is polycrystal and strongly (111) oriented (see, e.g., Journal of Applied Physics, 1991, vol. 70, No. 1, pp. 382–388). In this case, when the ferroelectric film 102 is formed of PZT having a Zr/Ti composition ratio of below 0.52/0.48 and tetragonal system crystal structure, the PZT film is strongly also (111) oriented under the influence of the platinum film whose lattice structure is similar.

In applying such ferroelectric capacitors to an nonvolatile memory device, information is written by controlling polarization directions of the ferroelectric film. Polarization directions of PZT having tetragonal system are <001> direction because average positions of plus ions and minus ions are offset from each other in <001> direction. Accordingly, in the ferroelectric capacitor having the (111) oriented PZT film, as shown in FIG. 19B, polarization directions (indicated by the arrows in the drawing) of the PZT film are oblique to a voltage application direction. Consequently, with respect to a voltage application direction of the capacitor, the polarization which can be obtained is smaller than an intrinsic polarization of PZT.

A region where directions of polarization are aligned is called a domain. In (111) oriented PZT, as shown in FIG. 19B, a domain wall (180° domain wall 106) across which domains having polarization directions different from each other by 180° are adjacent to each other, and a domain wall (90° domain wall 108) across which domains having polarization directions different from each other by 90° are adjacent to each other are present. Upon the polarization inversion at the time of application of a voltage, no stress takes place in the 180° domain wall 106, but stresses take place in the 90° domain wall 108. Characteristics of the ferroelectric capacitor, data retention characteristics especially in nonvolatile memory devices are much degraded. Accordingly, to fabricate an nonvolatile memory device having good characteristics it is preferable that a ferroelectric film having no 90° domain wall 108 but having only the 180° domain wall 106 is used.

Ferroelectric films having 180° domain walls alone are, e.g., (001) oriented tetragonal PZT film and (111) oriented rhombohedral PZT film. As shown in FIG. 19C, the (001) oriented tetragonal PZT film and the (111) oriented rhombohedral PZT film have no 90° domain wall and has 180° domain walls alone. Furthermore, a voltage application direction and polarization directions (indicated by the arrows in the drawing) of the capacitor are parallel with each other, whereby the intrinsic polarization intensity of the substance can be utilized as it is in the ferroelectric capacitor.

To form (001) oriented PZT film, single crystal (100) MgO substrate and single crystal (100) $SrTiO_3$ substrate have been used as substrates. As shown in FIG. 20, platinum film is deposited on, e.g., a single crystal (100) MgO substrate by sputtering method at high temperature, whereby (100) oriented platinum film 112 can be formed on the MgO substrate 110 under the influence of the planar orientation of the MgO substrate 110. PZT film is deposited on the (100) oriented platinum film 112, whereby a (001) oriented PZT film 114 can be formed under the influence of the orientation direction of the platinum film (see, e.g., Journal of Applied Physics, 1991, vol. 69, No. 12, pp. 8352–8357).

FIG. 21 is a graph of data retention characteristics of an nonvolatile memory device using a ferroelectric capacitors including (111) oriented PZT film, and an nonvolatile memory device using ferroelectric capacitors including (001) oriented PZT film. The ferroelectric capacitor including the (111) oriented PZT film comprises a lower electrode of (111) oriented platinum film formed on a silicon substrate with a silicon oxide film formed on, and the (111) oriented PZT film formed on the (111) oriented platinum film. The ferroelectric capacitor including the (001) oriented PZT film comprises a lower electrode of the (100) oriented platinum film formed on a (100) MgO substrate, and the (001) oriented PZT film formed on the (100) oriented platinum film. In the graph, retention times after data writing are taken on the horizontal axis, and normalized polarization is taken on the vertical axis.

As shown, in the case that the (111) oriented PZT film is used, the polarization decrease as the retention times increase, while in the case that the (001) oriented PZT film is used, decreases of polarization can be suppressed.

In the nonvolatile semiconductor memory device using ferroelectric capacitors, the ferroelectric capacitors are formed over a silicon substrate with active elements formed on, interposing an amorphous insulation film therebetween. Platinum film as the lower electrodes is formed on an adhesion layer of, e.g., $TiO_3$ film on the amorphous insulation film. The thus-formed platinum film becomes (111) oriented film. Thus in the conventional nonvolatile memory device, the PZT film formed on the platinum film also becomes (111) oriented film. Ferroelectric capacitors including (001) oriented PZT having good data retention characteristics cannot be formed.

A method of forming (100) oriented platinum film on an amorphous insulation film on a silicon substrate by sputtering method using Ar gas and $O_2$ gas is described in, e.g., Journal of Material Research, 1999, vol. 14, No. 3, pp. 634–637. PZT deposited on the (100) oriented platinum film becomes (100) oriented PZT film, and (001) oriented PZT film cannot be formed. (100) oriented PZT film has the polarization direction which is perpendicular to an electric filed application direction, and the resultant polarization is very small.

As described above, in the conventional capacitors using the ferroelectric materials, especially formed over a silicon substrate interposing an amorphous insulation film therebetween, PZT film having a polarization axis parallel with an electric field application direction cannot be formed. Nonvolatile memory devices using such capacitors could not have sufficient data retention characteristics.

SUMMARY OF THE INVENTION

An object of the present invention is to provide a ferroelectric capacitor including a ferroelectric film having a polarization axis parallel with an electric field application direction and a method for fabricating the same, and a semiconductor device comprising such the ferroelectric capacitor and good data retention characteristics and a method for fabricating the same.

According to one aspect of the present invention, there is provided a capacitor comprising: a buffer structure formed on a substrate; a lower electrode formed on the buffer structure; a capacitor dielectric film formed on the lower electrode, and formed of a perovskite ferroelectric material having a smaller thermal expansion coefficient than that of the buffer structure and having a crystal oriented substantially perpendicular to a surface of the lower electrode; and an upper electrode formed on the capacitor dielectric film.

According to another aspect of the present invention, there is provided a capacitor comprising: a lower electrode formed on a substrate; a capacitor dielectric film formed on the lower electrode, and formed of a perovskite ferroelectric material having a larger thermal expansion coefficient than that of the substrate and having a crystal oriented substantially perpendicular to a surface of the lower electrode; and an upper electrode formed on the capacitor dielectric film.

According to further another aspect of the present invention, there is provided a semiconductor device comprising: a memory cell transistor formed on a semiconductor substrate, and including a gate electrode, and source/drain diffused layers formed in the semiconductor substrate respectively on both sides of the gate electrode; an insulation film covering the semiconductor substrate with the memory cell transistor formed on; a buffer structure formed on the insulation film; and a capacitor formed on the buffer structure, and including a lower electrode electrically connected to one of the source/drain diffused layers; a capacitor dielectric film formed on the lower electrode, and formed of a perovskite ferroelectric material having a smaller thermal expansion coefficient than that of the buffer structure and having a crystal oriented substantially perpendicular to a surface of the lower electrode; and an upper electrode formed on the capacitor dielectric film.

According to further another aspect of the present invention, there is provided a semiconductor device comprising: a memory cell transistor formed on a semiconductor substrate and including a gate electrode, and source/drain diffused layers formed in the semiconductor substrate respectively on both sides of the gate electrode; an insulation film covering the semiconductor substrate with the memory cell transistor formed on; and a capacitor formed on the insulation film, and including a lower electrode electrically connected to one of the source/drain diffused layers; a capacitor dielectric film formed on the lower electrode, and formed of a perovskite ferroelectric material having a larger thermal expansion coefficient than that of the semiconductor substrate and having a crystal oriented substantially perpendicular to a surface of the lower electrode; and an upper electrode formed on the capacitor dielectric film.

According to further another aspect of the present invention, there is provided a method for fabricating a capacitor comprising the steps of: forming a buffer structure on a substrate: forming a lower electrode on the buffer structure; forming on the lower electrode a capacitor dielectric film of a perovskite ferroelectric material having a smaller thermal expansion coefficient than that of the buffer structure and having a crystal oriented substantially perpendicular to a surface of the lower electrode; and forming an upper electrode on the capacitor dielectric film.

According to further another aspect of the present invention, there is provided a method for fabricating a capacitor comprising the steps of: forming a lower electrode on a substrate; forming on the lower electrode a capacitor dielectric film of a perovskite ferroelectric material having a larger thermal expansion coefficient than that of the substrate and having a crystal oriented substantially perpendicular to a surface of the lower electrode; and forming an upper electrode on the capacitor dielectric film.

According to further another aspect of the present invention, there is provided a method for fabricating a semiconductor device comprising the steps of: forming on a semiconductor substrate a memory cell transistor including a gate electrode, and source/drain diffused layers formed in the semiconductor substrate respectively on both sides of the gate electrode; forming an insulation film on the semiconductor substrate with the memory cell transistor formed on; forming a buffer structure on the insulation film; forming on the buffer structure a lower electrode electrically connected to one of the source/drain diffused layers; forming on the lower electrode a capacitor dielectric film of a perovskite ferroelectric material having a smaller thermal expansion coefficient than that of the buffer structure and having a crystal oriented substantially perpendicular to a surface of the lower electrode; and forming an upper electrode on the capacitor dielectric film.

According to further another aspect of the present invention, there is provided a method for fabricating a semiconductor device comprising the steps of: forming on a semiconductor substrate a memory cell transistor including a gate electrode, and source/drain diffused layers formed in the semiconductor substrate respectively on both sides of the gate electrode; forming an insulation film on the semiconductor substrate with the memory cell transistor formed on; forming on the insulation film a lower electrode electrically connected to one of the source/drain diffused layers; forming on the lower electrode a capacitor dielectric film of a perovskite ferroelectric material having a larger thermal expansion coefficient than that of the semiconductor substrate and having a crystal oriented substantially perpendicular to a surface of the lower electrode; and forming an upper electrode on the capacitor dielectric film.

According to the present invention, the structure as the buffer layer for mitigating the influence of the stress from the substrate is formed below the lower electrode, whereby even in a case that the substrate is formed of a material whose thermal expansion coefficient is smaller than that of the capacitor dielectric film, the capacitor dielectric film whose crystal is oriented perpendicular to the surface of the lower electrode can be formed. Accordingly, polarization directions of the capacitor dielectric film can be made parallel with a direction of an electric field applied between the upper electrode and the lower electrode, whereby an intrinsic polarization of the ferroelectric film can be utilized as it is.

The lower electrode provides the structure which functions also as the buffer layer for mitigating the influence of the stress from the substrate, whereby even in a case that the substrate is formed of a material whose thermal expansion coefficient is smaller than that of the capacitor dielectric film, the capacitor dielectric film whose crystal is oriented perpendicular to the surface of the lower electrode can be formed. Accordingly, a polarization direction of the capacitor dielectric film can be parallel with a direction of an electric field applied between the upper electrode and the lower electrode, and an intrinsic polarization of the ferroelectric film can be utilized as it is.

DETAILED DESCRIPTION OF THE INVENTION

[Principle of The Present Invention]

As described above, even in a case that PZT film is formed on (100) oriented platinum film, the PZT film formed on the platinum film has different orientations depending on whether the base structure is (100) MgO film or an amorphous insulation film formed on a silicon substrate.

The inventors of the present application made earnest studies of causes for the PZT film having different orientation directions depending on base structures of the platinum film and have found for the first time that the difference in thermal expansion coefficient between the ferroelectric film and the base substrate is very influential to orientation of the PZT film. Based on the result of their studies, the inventors consider relationships between the orientation of PZT film and thermal expansion coefficients to be as follows.

High temperatures are necessary to crystallize the PZT film, so that the PZT film is deposited at a film forming temperature which is above a Curie point (Tc), or the PZT film is subjected, after deposition, to thermal processing at a temperature higher than a Curie point. Thus, in cooling the substrate after the deposition of the PZT film, stress due to the difference in thermal expansion coefficient between the base substrate and the PZT film is applied to the PZT. Here, the thermal expansion coefficient of MgO is larger than that of PZT, and the thermal expansion coefficient of silicon is smaller than that of PZT. Accordingly, in a case that PZT film is formed on a platinum film formed on an MgO substrate, compression stress is applied to the PZT film, and in a case that PZT film is formed on an amorphous insulation film formed on a silicon substrate, reversely tensile stress is applied to the PZT film. The inventors of the present application consider that such different stresses is influential to orientation of the PZT film after cooled. When the tensile stress is exerted to the PZT film, the PZT film undergoes the phase transition from (100) oriented cubic system to (100) oriented tetragonal system. In order to obtain (001) oriented PZT film it will be necessary to use a substrate having a thermal expansion coefficient larger than that of PZT.

Figure 22:
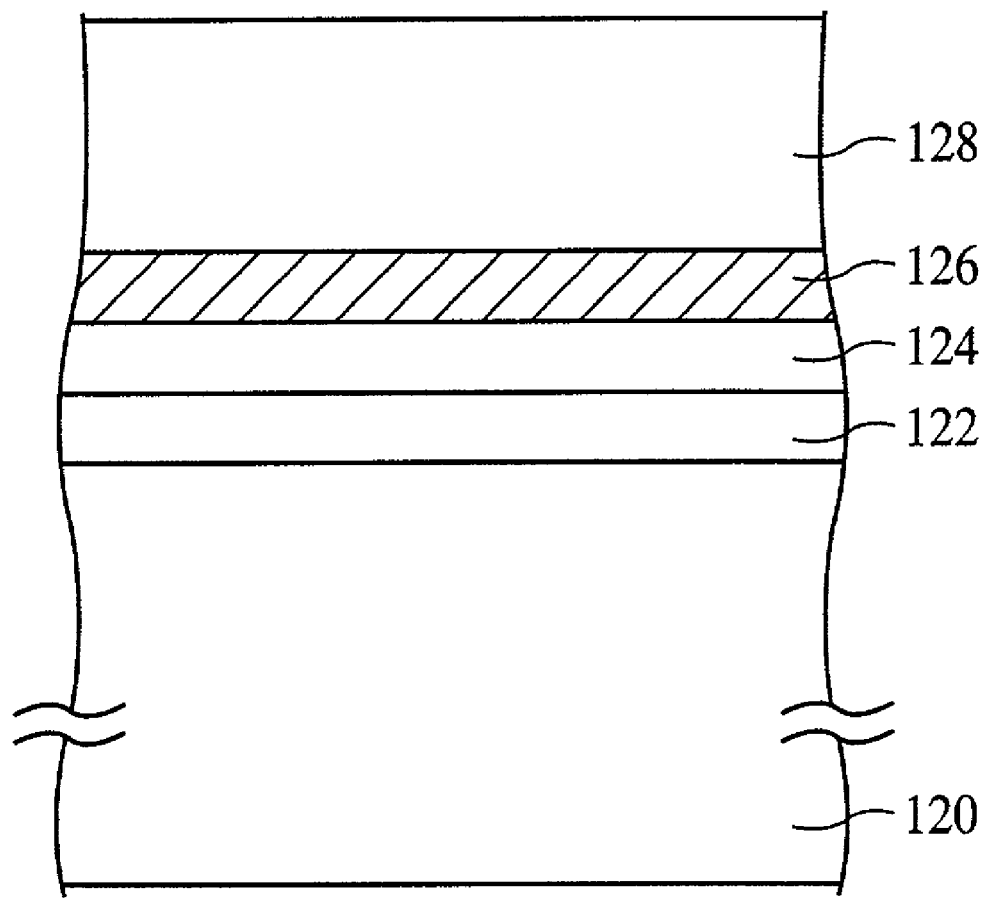
FIG. 22 is a diagrammatic sectional view showing the structure including the buffer layer having larger thermal expansion coefficient than the ferroelectric film formed under the lower electrode.

However, when a (100) oriented platinum film 126 as a lower electrode is formed, as shown in FIG. 22, on a (100) oriented buffer layer 124 formed of a material of large thermal expansion coefficient, such as MgO, on an amorphous insulation film 122 formed on a silicon substrate 120, the PZT film on the platinum film 126 is (100) oriented, and (001) oriented PZT film cannot be obtained. This is because the influence of the stress due to the thermal expansion coefficient is dominated by a thermal expansion coefficient of a thickest film in the system. In the system shown in FIG. 22, the stress to be exerted to the PZT is determined by the thermal expansion coefficient of silicon as the substrate and that of PZT.

Based on this, from the viewpoint of preventing the application of the stress due to the thermal expansion coefficient difference between the substrate and the ferroelectric film to the ferroelectric film, the inventors of the present application had the idea of providing below the ferroelectric film a structure as a buffer layer, which is formed of a material of a larger thermal expansion coefficient than the ferroelectric and has a height larger than a width along which the structure contacts the base, and has succeeded in forming a capacitor comprising a ferroelectric film whose polarization axis is parallel with an electric field application direction.

Figure 1A:
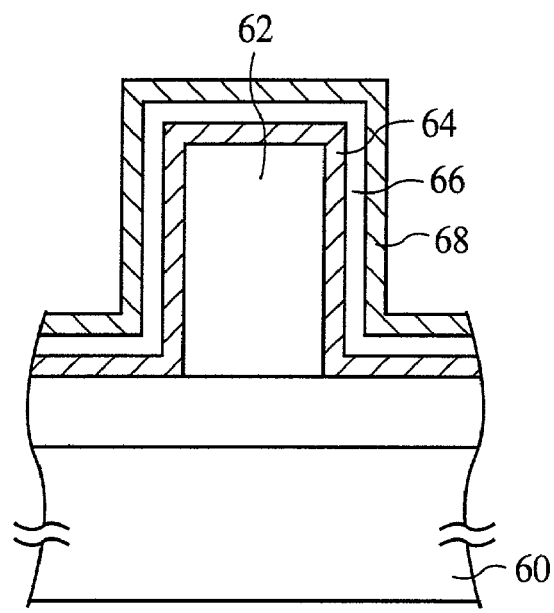
FIGS. 1A and 1B are diagrammatic sectional views of the semiconductor device showing a principle of the semiconductor device and the method for fabricating the same according to the present invention.

That is, the capacitor according to the present invention is characterized by, as shown in FIG. 1A, comprising a structure as a buffer layer 62 also called a buffer structure) formed over a substrate 60, a lower electrode 64 formed on the buffer structure 62, a capacitor dielectric film 66 formed on the lower electrode 64 and formed of a perovskite ferroelectric material having a smaller thermal expansion coefficient than that of the buffer structure 62 and having crystals oriented substantially perpendicular to a surface of the lower electrode 64, and an upper electrode 68 formed on a capacitor dielectric film 66.

Figure 1B:
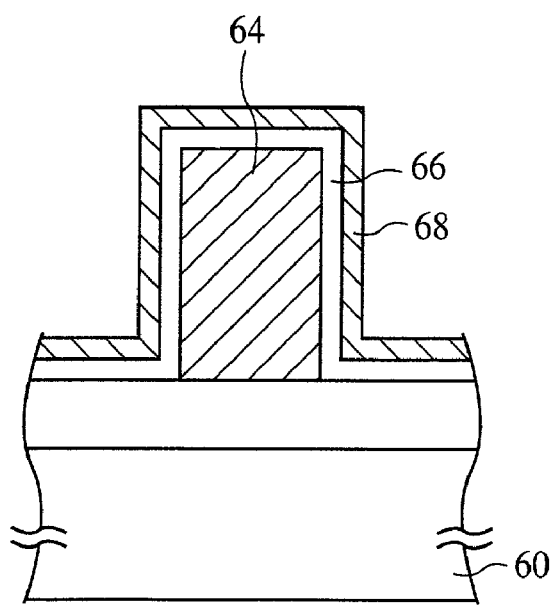

The capacitor according to the present invention is characterized also by, as shown in FIG. 1B, comprising a lower electrode 64 formed over a substrate 60, a capacitor dielectric film 66 formed on the lower electrode 64 and formed of a perovskite ferroelectric material having a larger thermal expansion coefficient than that of the substrate 60 and having crystals oriented substantially perpendicular to a surface of the lower electrode 64, and an upper electrode 68 formed on the capacitor dielectric film 68.

The ferroelectric film is formed on the structure as the buffer layer or the lower electrode functioning also as the buffer layer, whereby the stress due to thermal expansion coefficient difference between the ferroelectric film and the substrate can be absorbed. Consequently, in the cooling processing following the deposition or the thermal crystallization processing of the ferroelectric film, transition of the orientation of the ferroelectric film due to the tensile stress can be prevented. Accordingly, the ferroelectric film has an orientation which is depend on an orientation of the buffer structure or the lower electrode, whereby a capacitor comprising a ferroelectric film oriented substantially perpendicular to a surface of the lower electrode, i.e., having a polarization axis parallel with an electric field application direction can be formed.

It is necessary that the buffer structure has a configuration suitable not to apply to the ferroelectric film the stress due to the thermal expansion coefficient difference between the substrate and the ferroelectric film. It will be preferable that the buffer structure has a pillar-shaped body having a relatively small contact area with respect to the base from the viewpoint of preventing the application of the stress due to the thermal expansion coefficient difference between the substrate and the ferroelectric film to the ferroelectric film. It will be necessary that a height of the buffer structure is larger than at least a width along which the buffer structure contact the base. Although the inventors of the present application has found no critical value of the configuration of the buffer structure, the effect of preventing the application of the stress to the ferroelectric film will be higher as a ratio of the height of the buffer structure to the contact width thereof with respect to the base is higher. It is preferable that a ratio of the height of the buffer structure to a width thereof along which the buffer structure contacts the base is selected corresponding to a thermal expansion coefficient difference between the substrate and the ferroelectric film.

The buffer structure may be provided as the base film of the lower electrode as shown in FIG. 1A or may be provided by the lower electrode itself as shown in FIG. 1B.

An orientation of the film forming the buffer layer is selected suitably corresponding to an orientation of the ferroelectric film to be formed.

The ferroelectric having perovskite structure has tetragonal system or rhombohedral system. For example, in a case that the ferroelectric is PZT-based and has a composition $Pb(Zr_{1-x}Ti_x)O_2$, the ferroelectric has tetragonal system when a composition ratio x is $x \geq 0.48$, and when a composition ratio x is $x \leq 0.48$, the ferroelectric has rhombohedral system. The ferroelectric film of tetragonal system is suitable for the ferroelectric capacitor when the ferroelectric film is (001) oriented, and the ferroelectric film of rhombohedral system is suitable for the ferroelectric capacitor when the ferroelectric film is (111) oriented.

In a case that the ferroelectric film of tetragonal system is used, the base film is formed of a (100) oriented film, whereby the ferroelectric film tends to have (100) oriented cubic system in the deposition processing at temperatures higher than a Curie temperature or in thermal crystallization processing at temperatures higher than a Curie temperature. The (100) oriented ferroelectric film undergoes phase transition from cubic system to tetragonal system in cooling from a temperature higher than a Curie temperature to the room temperature. At this time, the ferroelectric film is subjected to compression stress by the buffer layer, and the ferroelectric film can have (001) oriented tetragonal system.

In a case that the ferroelectric film of rhombohedral system is used, the base film is formed of a (111) oriented film, whereby the ferroelectric film tends to have (111) oriented cubic system in the deposition processing at temperatures higher than a Curie temperature or in thermal crystallization processing at temperatures higher than a Curie temperature. The (111) oriented ferroelectric film undergoes phase transition from cubic system to rhombohedral system in cooling from a temperature higher than a Curie temperature to the room temperature. Rhombohedral system has, in addition of 180° domain, 70° domain and 110° domain where polarization directions are oblique to the base surface, but in the phase transition, the ferroelectric thin film is subjected to uniform compression stress by the buffer layer to be of rhombohedral system which is (111) oriented, i.e., oriented in the polarization direction.

In a case that the lower electrode is formed of platinum, when the (001) oriented tetragonal ferroelectric film is formed on the lower electrode, it is necessary to form (100) oriented platinum film. To form the (111) oriented rhombohedral ferroelectric film, it is necessary to form (111) oriented platinum film.

The buffer structure can be formed of, e.g., MgO, $MgAl_2O_4$, CaO, $ZrO_2$, $Y_2O_3$, etc. when the buffer layer is formed of an insulating material. These insulating materials have cubic system, and their orientation can be controlled by controlling total pressures for forming them. When the buffer layer is formed of an conducting material, the buffer layer can be formed of, e.g., platinum, silver (Ag), gold (Au), chrome (Cr), copper (Cu), iridium (Ir), nickel (Ni), tantalum (Ta), titanium (Ti), etc. Their orientation can be controlled by introducing oxygen ($O_2$) gas in argon (Ar) gas for their deposition to control partial pressures of the oxygen gas. Out of these materials, noble metals, which are compatible with the ferroelectric film, can be used as common materials of the buffer structure, and the lower electrode.

The buffer structure is not limited to the solid pillar-shaped body as shown in FIG. 1 and can be a hollow pillar-shaped body which will be described e.g., in a third and a fourth embodiments.

The present invention is applicable widely to ferroelectric materials of perovskite structure. The present invention is applied to $SrTiO_3$ film, $Bi_2SrTaO_9$ film, etc. in addition to PZT film and can produce the same effects.

[First Embodiment]

The semiconductor device and the method for fabricating the same according to a first embodiment of the present invention will be explained with reference to FIGS. 2, 3A–3D, 4A–4B, 5A–5B, and 6.

Figure 2:
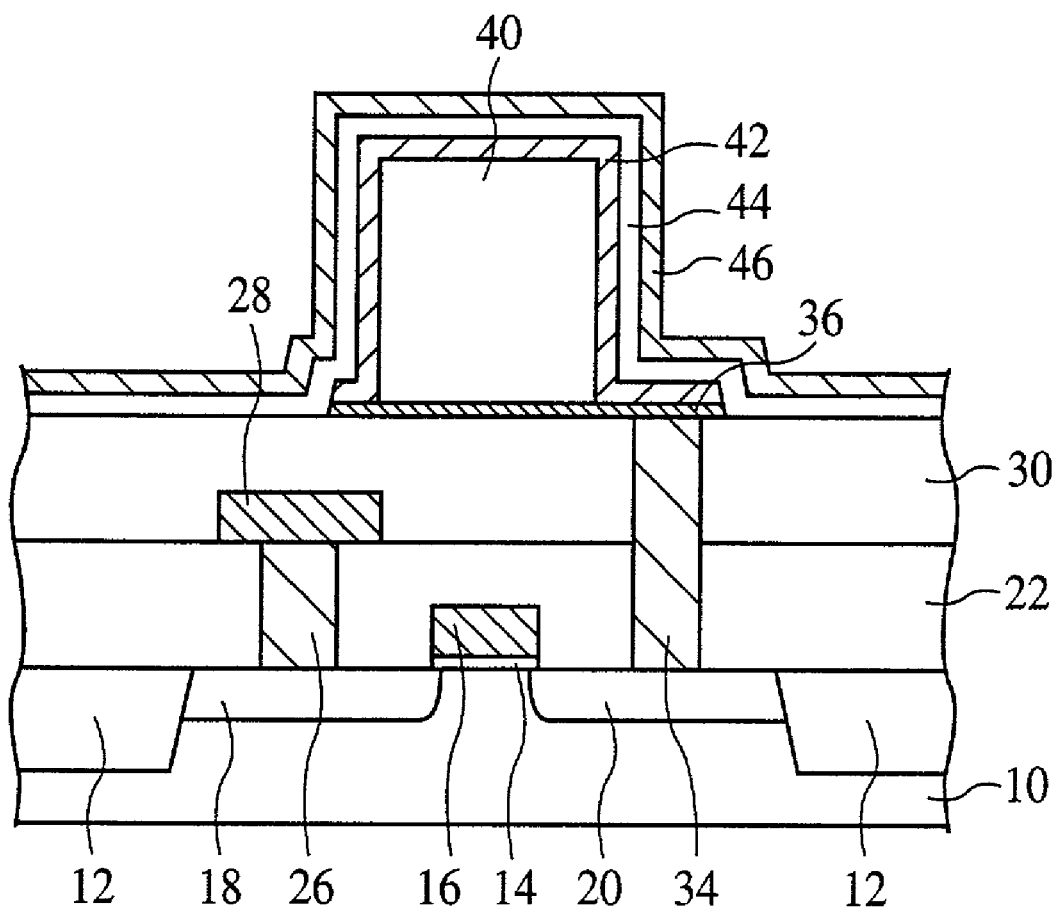
FIG. 2 is a diagrammatic sectional view of the semiconductor device according to a first embodiment of the present invention, which shows a structure thereof.

FIG. 2 is a diagrammatic sectional view of the semiconductor device according to the present embodiment, which shows a structure thereof. FIGS. 3A–3D, 4A–4B, and 5A–5B are sectional views of the semiconductor device according to the present embodiment in the steps of the method for fabricating the same, which show the method. FIG. 6 is a graph of data retention characteristics of the semiconductor device according to the present embodiment.

First, the structure of the semiconductor device according to the present embodiment will be explained with reference to FIG. 2.

On a silicon substrate 10 there is formed a memory cell transistor comprising a gate electrode 16 formed on the silicon substrate 10 interposing a gate insulation film 14 therebetween, and a source/drain diffused layer 18, 20 formed in the silicon substrate 10 on both sides of the gate electrode 16. An inter-layer insulation film 22 is formed on the silicon substrate 10 with the memory cell transistor formed on. A plug 26 s buried in the inter-layer insulation film 22, electrically connected to the source/drain diffused layer 18. A bit line 28 is formed on the inter-layer insulation film 22, electrically connected to the source/drain diffused layer 18 through the plug 26. An inter-layer insulation film 30 is formed on the inter-layer insulation film 22 with the bit line 28 formed on. A plug 34 is buried in the inter-layer insulation films 30, 22, electrically connected to the source/drain diffused layer 20.

A barrier metal layer 36 is formed on the inter-layer insulation film 30 with the plug 34 buried in. A structure as a buffer layer (buffer structure) 40 of (100) oriented MgO film is formed on the barrier metal layer 36. A lower electrode 42 of (100) oriented platinum film is formed on the barrier metal layer 36, and the upper surface and the side surface of the buffer structure 40, electrically connected to the source/drain diffused layer 20 via the barrier metal layer 36 and the plug 34. On the lower electrode 42, a capacitor dielectric film 44 of (001) oriented tetragonal PZT film is formed. An upper electrode 46 of a platinum film is formed on the capacitor dielectric film 44. Thus, the lower electrode 42, the capacitor dielectric film 44 and the upper electrode 46 constitute a ferroelectric capacitor.

Thus, a ferroelectric memory device comprising one transistor and one capacitor is fabricated.

The semiconductor device according to the present embodiment is characterized mainly in that although silicon whose thermal expansion coefficient is smaller than that of the capacitor dielectric film 44 is used as the substrate, the capacitor dielectric film 44 is formed of a (001) oriented film. When the tetragonal PZT film is used as the capacitor dielectric film 44, a polarization direction of the (001) oriented PZT film is parallel with a direction of an electric field applied between the upper electrode 46 and the lower electrode 42. Accordingly, the intrinsic polarization of PZT film can be utilized as it is.

In the semiconductor device according to the present embodiment, in order to allow (001) oriented tetragonal PZT film to be formed over the silicon substrate 10, the buffer structure 40 of MgO film whose thermal expansion coefficient is larger than that of the capacitor dielectric film is provided below the lower electrode 42. The buffer structure 40 prohibits the application of a tensile stress due to a difference of the thermal expansion coefficients between the silicon substrate 10 and the PZT film to the PZT film and reversely permits the application of a compression stress due to the difference of the thermal expansion coefficients between the buffer structure 40 and the PZT film to the PZT film, whereby the (001) oriented tetragonal PZT film can be formed on the lower electrode 42.

Then, the method for fabricating the semiconductor device according to the present embodiment will be explained with reference to FIGS. 3A–3D, 4A–4B, and 5A–5B.

First, a device isolation film 12 is formed on the silicon substrate 20 by, e.g., shallow trench method.

Figure 3A:
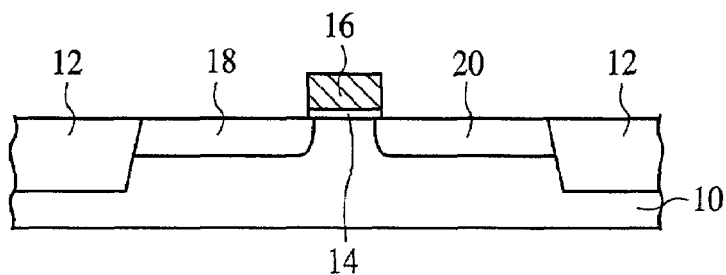
FIGS. 3A–3D, 4A–4B, and 5A–5B are sectional views of the semiconductor device according to the first embodiment of the present invention in the steps of the method for fabricating the same, which show the method.

Then, a memory cell transistor comprising a gate electrode 16 formed on the silicon substrate 10 interposing the gate insulation film 14 therebetween, and the source/drain diffused layer 18, 20 formed in the silicon substrate 10 on both side of the gate electrode 16 is formed on a device region defined by the device isolation film 12 in the same way as in the usual MOS transistor forming method (FIG. 3A).

Next, a silicon oxide film is deposited on the silicon substrate 10 with the memory cell transistor formed on to form the inter-layer insulation film 22 of the silicon oxide film.

Then, the surface of the inter-layer insulation film 22 is polished by, e.g., CMP (Chemical Mechanical Polishing) method to planarize the surface of the inter-layer insulation film 22.

Figure 3B:
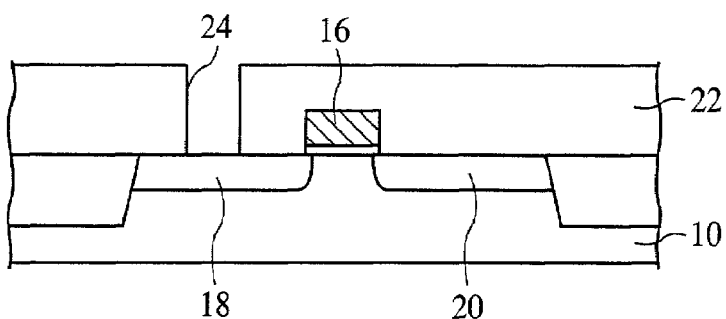

A contact hole 24 is formed in the inter-layer insulation film 22 by lithography and etching down to the source/drain diffused layer 18 (FIG. 3B).

Next, the adhesion layer of a layer structure of titanium nitride (TiN)/titanium (Ti), and a tungsten (W) film are deposited by, e.g., sputtering method and are polished by CMP method until the surface of the inter-layer insulation film 22 is exposed. Thus, the plug 26 is formed, buried in the contact hole 24 and electrically connected to the source/drain diffused layer 18.

Figure 3C:
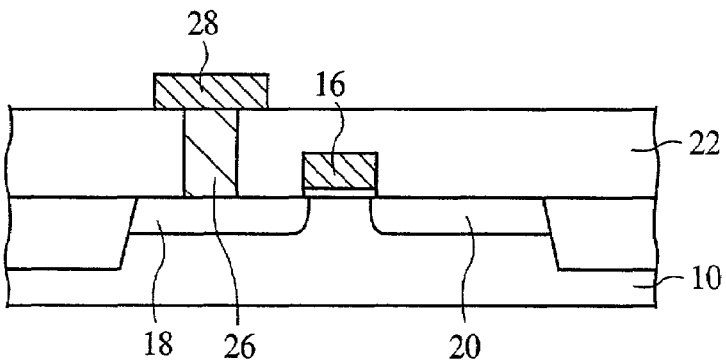

Then, a tungsten film is deposited by, e.g., sputtering method and is patterned by lithography and etching to form the bit line 28 formed of the tungsten film and connected to the source/drain diffused layer 18 via the plug 26 (FIG. 3C).

Then, a silicon oxide film is deposited by, e.g., CVD method on the inter-layer insulation film 22 with the bit line 28 formed on to form the inter-layer insulation film 30 of the silicon oxide film.

Figure 3D:
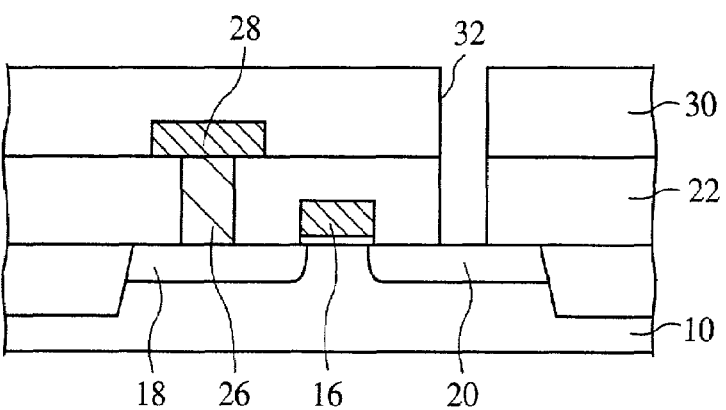

Next, a contact hole 32 is formed in the inter-layer insulation films 30, 22 down to the source/drain diffused layer 20 by lithography and etching (FIG. 3D).

Then, an adhesion layer of a layer structure of titanium nitride/titanium, and a tungsten film are deposited by, e.g., sputtering method and are polished by CMP method until the surface of the inter-layer insulation film 30 is exposed. Thus, the plug 34 is formed, buried in the contact hole 32 and electrically connected to the source/drain diffused layer 20.

Next, a titanium nitride film is deposited by, e.g., sputtering method on the inter-layer insulation film 30 with the plug 34 buried in to form the barrier metal layer 36 of the titanium nitride film.

Figure 4A:
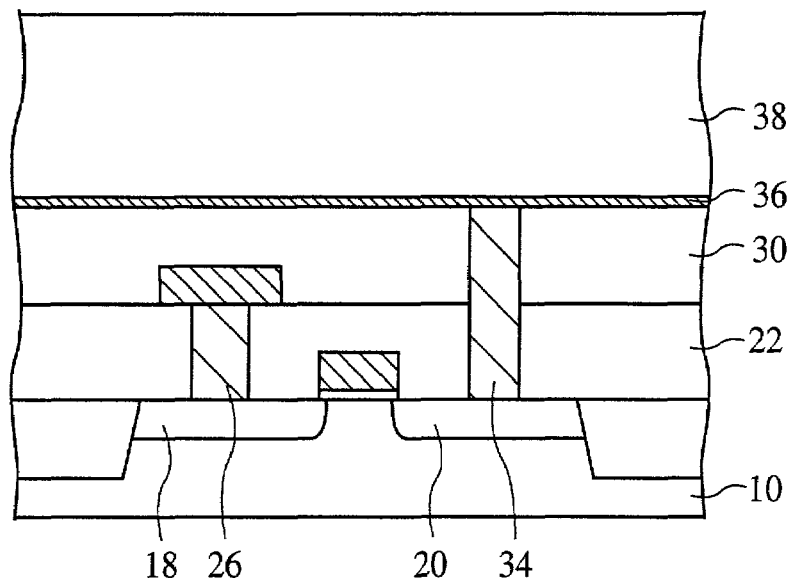

Next, a 600 nm-thick (100) oriented MgO film 38 is deposited on the barrier metal layer 36 by, e.g., reactive sputtering method (FIG. 4A). The MgO film is formed, for example, with magnesium (Mg) as the target, and at 500° C. substrate temperature, 30 sccm argon (Ar) gas flow rate and 20 sccm oxygen ($O_2$) gas flow rate, and 30 mTorr pressure, whereby the (100) oriented MgO film can be formed.

Figure 4B:
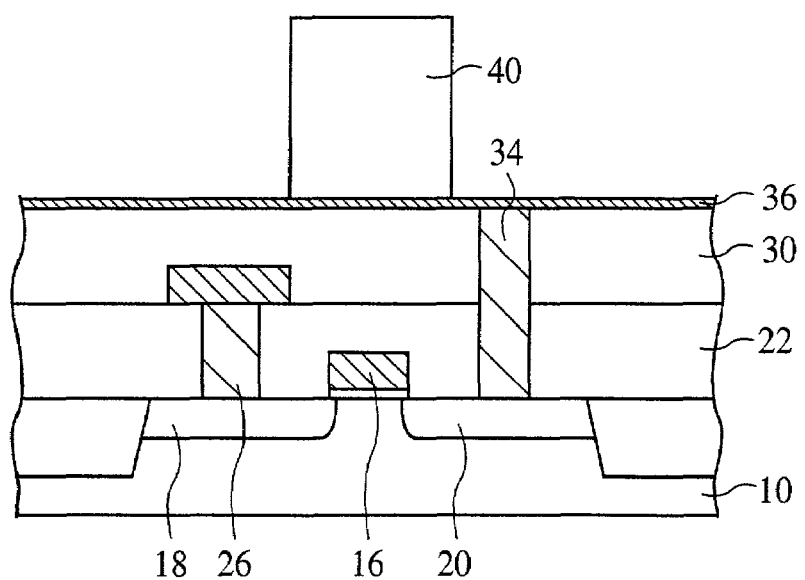

Next, the MgO film 38 is patterned by lithography and ion milling to form the buffer structure 40 of an about 600 nm-height and an about 500 nm-width (100) oriented MgO film 38 (FIG. 4B).

The buffer structure 40 is for prohibiting the application of a stress from the silicon substrate 10 to the capacitor dielectric film 44, and has a height which is at least larger than a width along which the buffer structure 40 is in contact with the base. The buffer structure 40 also functions to apply a compression stress to the capacitor dielectric film 44, and it is necessary to select, as a material forming the buffer structure 40, a material having a larger thermal expansion coefficient which is larger than that of a material forming the capacitor dielectric film 44.

Then, a 60 nm-thick (100) oriented platinum film is deposited on the entire surface by, e.g., CVD method, which is superior in step coverage. The (100) oriented platinum film can be deposited by, e.g., a solution evaporation type CVD method in which oxygen gas is introduced to suitably control an oxygen partial pressure.

Figure 5A:
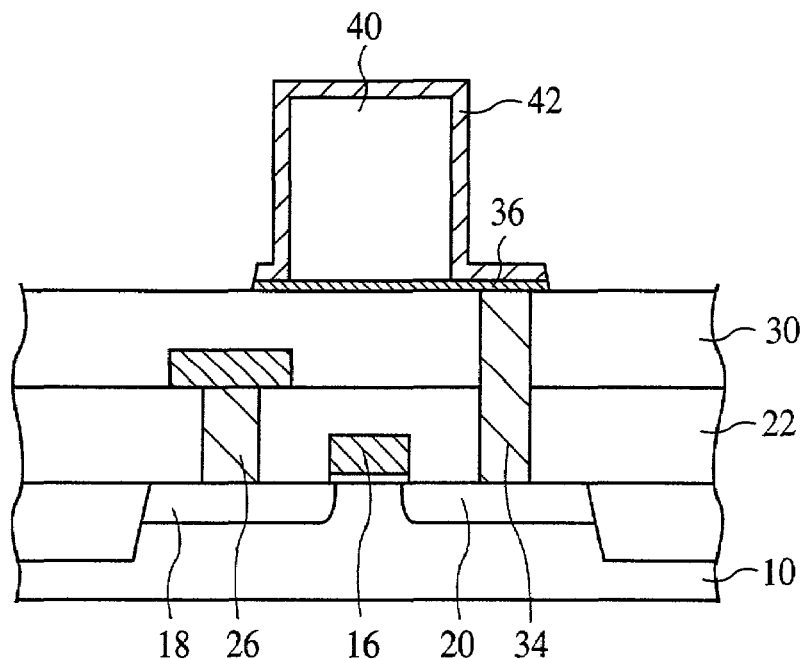
Figure 5B:
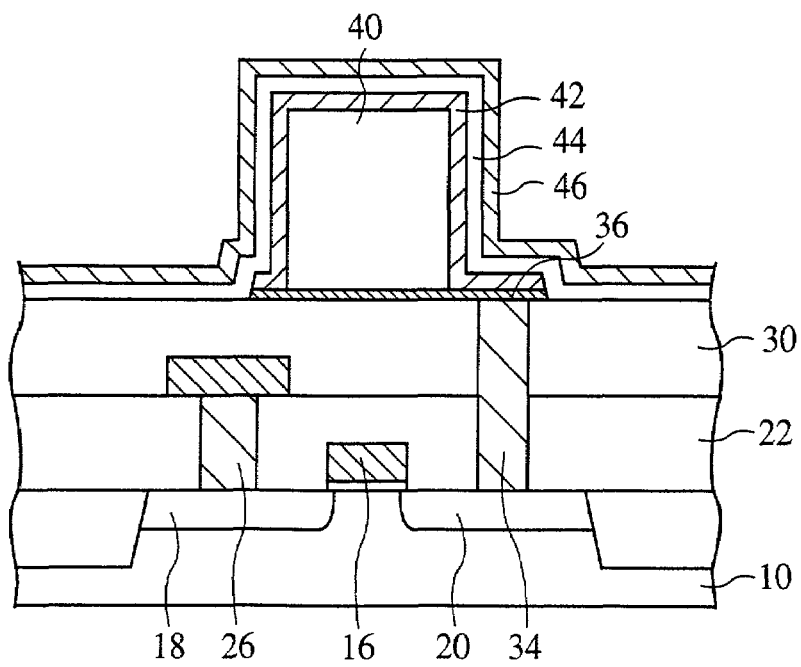
Figure 6:
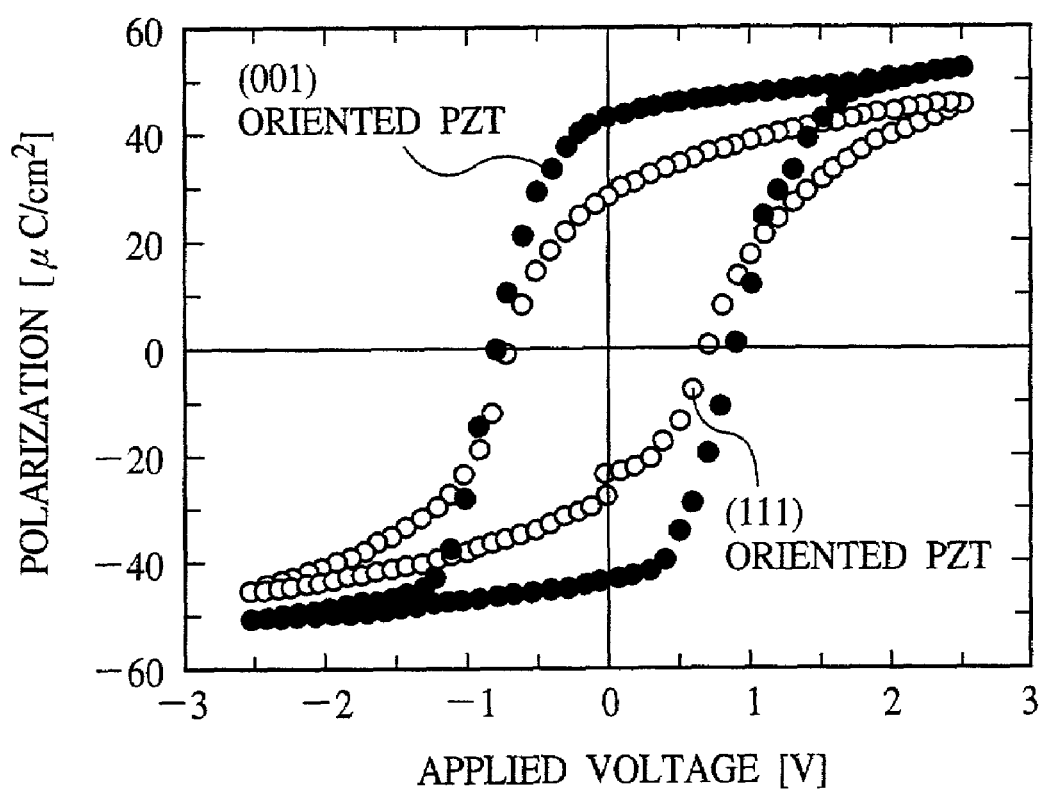
FIG. 6 is a graph of data retention characteristics of the semiconductor device according to the first embodiment of the present invention and the conventional semiconductor device.

Then, the platinum film and the barrier metal layer 36 are patterned by lithography and etching to form the lower electrode 42 formed of the platinum film and connected to the source/drain diffused layer 20 via the barrier metal layer 36 and the plug 34 (FIG. 5A).

Next, a 120 nm-thick PZT film of a Zr/Ti ratio of 45/55 is deposited on the lower electrode 42 by, e.g., a solution evaporation type CVD method at a temperature above a Curie point (Tc) to form the capacitor dielectric film 44 of the (100) oriented cubic PZT film. The (100) oriented cubic PZT film is subjected to a compression stress from the buffer structure 40 while being cooled from the deposition temperature to the room temperature and undergoes phase transition to the (001) oriented tetragonal PZT film.

In the cooling process, the tensile stress due to the thermal expansion coefficient difference between the silicon substrate 10 and the PZT film is a problem. However, because of the buffer structure 40 formed below the PZT film, the tensile stress is mitigated by the buffer structure 40, and in turn, the buffer structure 40 applies compression stress to the PZT film. Consequently, the deposited PZT film does not become a (100) oriented tetragonal film but becomes a (001) oriented tetragonal film.

Then, a 100 nm-thick platinum film is deposited on the entire surface by, e.g., a solution evaporation type CVD method to form the upper electrode 46 of the platinum film.

Thus, a ferroelectric memory device comprising one transistor and one capacitor and having polarization directions of the capacitor dielectric film, which are parallel with an electric field application direction can be formed.

FIG. 6 is a graph of data retention characteristics of the conventional semiconductor device using the (111) oriented PZT film and the semiconductor device according to the present embodiment using the (001) oriented PZT film. The measured results shown in FIG. 6 are data retention characteristics given by accelerated tests made at 150° C. and for 160 hours.

As shown in FIG. 6, an about 25% polarization decrease is found in the conventional semiconductor device using the (111) oriented PZT film, while the polarization decrease could be suppressed to about 5% in the semiconductor device according to the present embodiment.

In the case of using the (001) oriented film, the early polarization are larger by about 1.5 times in comparison with those of the case of using the (111) oriented film because the polarization directions are parallel with the electric field application direction. This means that in the case of using the (001) oriented film, even when a capacitor area is decreased to 1/1.5 times, characteristics equal to those of the case of using the (111) oriented film can be obtained, which makes it possible to further micronize ferroelectric memories.

As described above, according to the present embodiment, because of the buffer structure 40 for mitigating the influence of the stress from the silicon substrate 10 is provided below the lower electrode 42, whereby even in a case that the substrate is formed of silicon whose thermal expansion coefficient is smaller than that of the capacitor dielectric film 44, the (001) oriented capacitor dielectric film can be formed. Accordingly, polarization directions of the capacitor dielectric film can be made parallel with a direction of an electric field applied between the upper electrode 46 and the lower electrode 42, whereby an intrinsic polarization of the ferroelectric film can be utilized as it is.

Figure 7A:
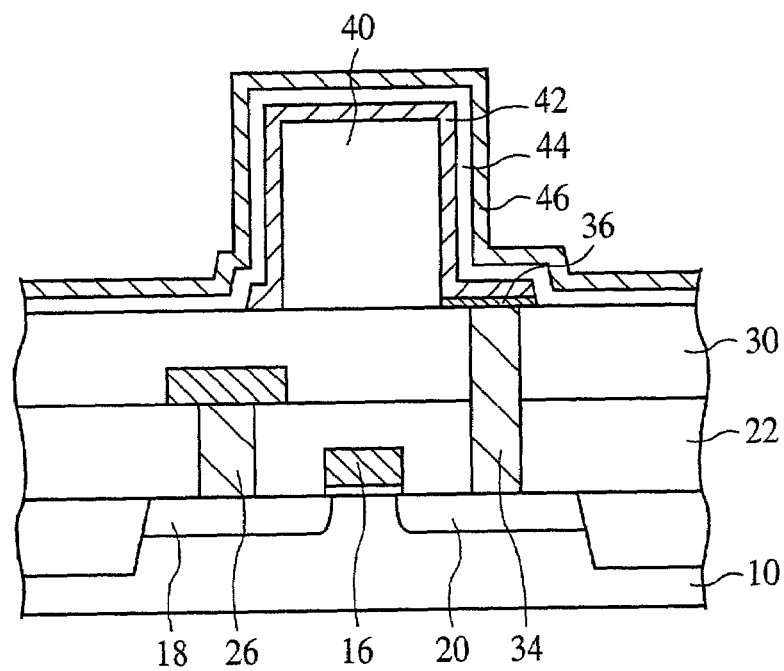
FIGS. 7A and 7B are diagrammatic sectional views of the semiconductor device according to a modification of the first embodiment of the present invention.
Figure 7B:
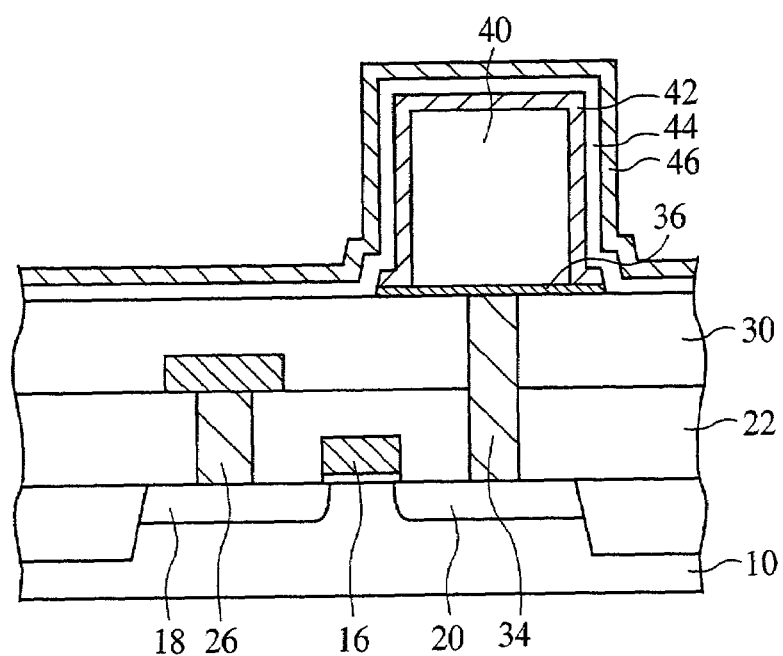

In the present embodiment, the barrier metal layer is provided between the lower electrode 42 and the plug 34 for improving adhesion between the lower electrode 42 and the base structure, and improving contact characteristics. The layout of the barrier metal layer 36 is not limited to that described in the present embodiment and can be various. For exemplified in FIG. 7A, the barrier metal layer 36 may be disposed selectively on the plug 34 without being extended below the buffer structure 40. As exemplified in FIG. 7B, the barrier metal layer 36 may be contacted to the plug 34 below the buffer structure 40.

[Second Embodiment]

The semiconductor device and the method for fabricating the same according to a second embodiment of the present invention will be explained with reference to FIGS. 8 and 9A–9B. The same members of the present embodiment as those of the semiconductor device and the method for fabricating the same according to the first embodiment are represented by the same reference numbers not to repeat or to simplify their explanation.

Figure 8:
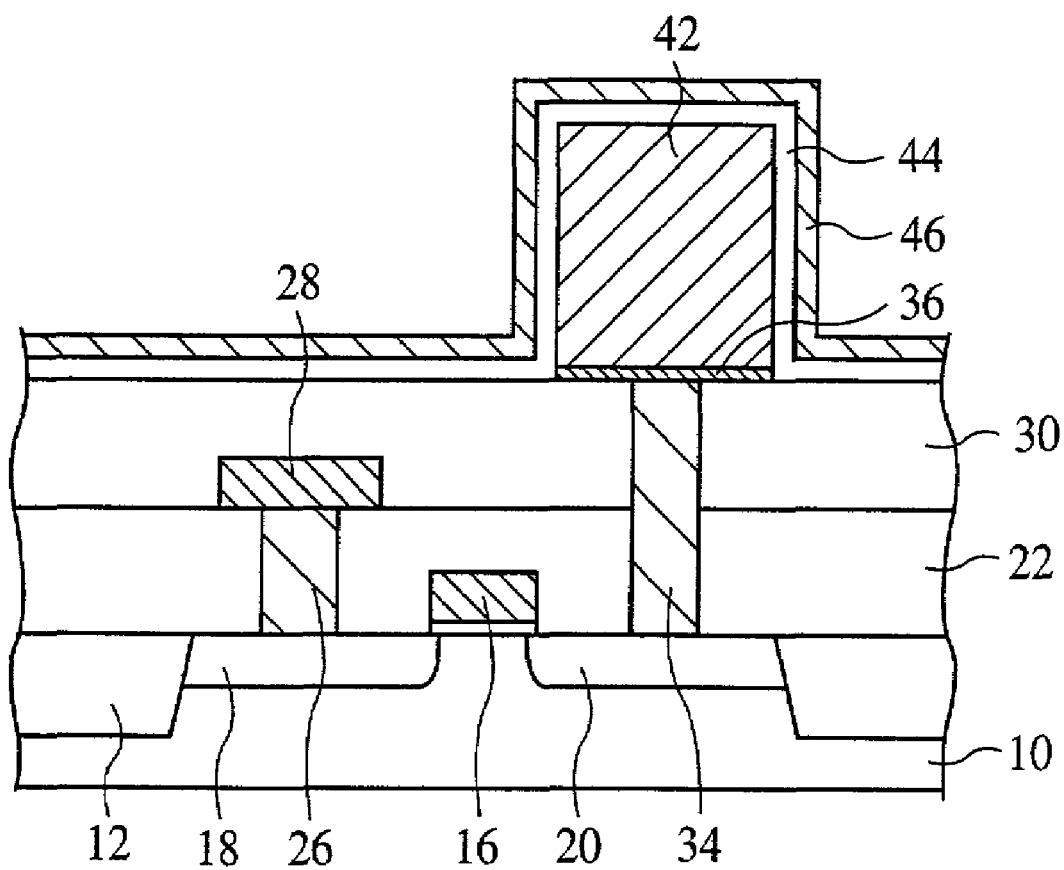
FIG. 8 is a diagrammatic sectional view of the semiconductor device according to a second embodiment of the present invention, which shows a structure thereof.

FIG. 8 is a diagrammatic sectional view of the semiconductor device according to the present embodiment, which shows a structure thereof. FIGS. 9A–9B are sectional views of the semiconductor device according to the present embodiment in the steps of the method for fabricating the same, which show the method.

First, the structure of the semiconductor device according to the present embodiment will be explained with reference to FIG. 8.

On a silicon substrate 10 there is formed a memory cell transistor comprising a gate electrode 16 formed on the silicon substrate 10 interposing a gate insulation film 14 therebetween, and a source/drain diffused layer 18, 20 formed in the silicon substrate 10 on both sides of the gate electrode 16. An inter-layer insulation film 22 is formed on the silicon substrate 10 with the memory cell transistor formed on. A plug 26 is buried in the inter-layer insulation film 22, electrically connected to source/drain diffused layer 18. A bit line 28 is formed on the inter-layer insulation film 22, electrically connected to the source/drain diffused layer 18 through the plug 26. An inter-layer insulation film 30 is formed on the inter-layer insulation film 22 with the bit line 28 formed on. A plug 34 is buried in the inter-layer insulation film 30, 22, electrically connected to the source/drain diffused layer 20.

A barrier metal layer 36 is formed on the inter-layer insulation film with the plug 34 buried in. A lower electrode 42 formed of a (100) oriented platinum film and electrically connected to the source/drain diffused layer 20 via the barrier metal 36 and the plug 34 is formed on the barrier metal layer 36. The lower electrode 42 also functions as a structure as a buffer layer (buffer structure). A height of the lower electrode 42 is larger than a width thereof. A capacitor dielectric film 44 of a (001) oriented tetragonal PZT film is formed on the lower electrode 42. An upper electrode 46 of a platinum film is formed on the capacitor dielectric film 44. Thus, the lower electrode 42, the capacitor dielectric film 44 and the upper electrode 46 constitute a ferroelectric capacitor.

Thus, a ferroelectric memory device comprising one transistor and one capacitor is formed.

The semiconductor device according to the present embodiment is characterized mainly in that although silicon whose thermal expansion coefficient is smaller than that of the capacitor dielectric film 44 is used as the substrate, the capacitor dielectric film 44 is formed of a (001) oriented film. When tetragonal PZT film is used as the capacitor dielectric film 44, a polarization direction of the (001) oriented film is parallel with a direction of an electric field applied between the upper electrode 46 and the lower electrode 42. Accordingly, the intrinsic polarization quantity of PZT film can be utilized as it is.

In the semiconductor device according to the present embodiment, in order to form the (001) oriented tetragonal PZT film over the silicon substrate 10, the buffer structure is provided by the lower electrode 42 of the (100) oriented platinum film. The lower electrode 42 prohibits the application of a tensile stress due to a difference of the thermal expansion coefficients between the silicon substrate 10 and the PZT film to the PZT film and reversely permits the application of a compression stress due to the difference of the thermal expansion coefficients between the lower electrode 42 and the PZT film to the PZT film, whereby the (001) oriented tetragonal PZT film can be formed on the lower electrode 42.

Then, the method for fabricating the semiconductor device according to the present embodiment will be explained with reference to FIGS. 9A–9B.

First, in the same way as, e.g., in the method for fabricating the semiconductor device according to the first embodiment shown in FIGS. 3A to 3D, memory cell transistor, inter-layer insulation films 22, 30, contact hole 32, etc. are formed.

Next, an adhesion layer of a layer structure of titanium nitride/titanium, and a tungsten film are deposited by, e.g., sputtering method and then polished by CMP method until the surface of the inter-layer insulation film 30 is exposed. Thus, the plug 34 is formed, buried in the contact hole 32 and electrically connected to the source/drain diffused layer 20.

Next, a titanium nitride film is deposited by, e.g., sputtering method on the inter-layer insulation film 30 with the plug 34 buried in to form the barrier metal layer 36 of the titanium nitride film.

Next, a 600 nm-thick (100) oriented platinum film is deposited on the barrier metal layer 36 by, e.g., CVD method. The (100) oriented platinum film can be deposited by, e.g., a solution evaporation type CVD method in which an oxygen partial pressure is controlled.

Figure 9A:
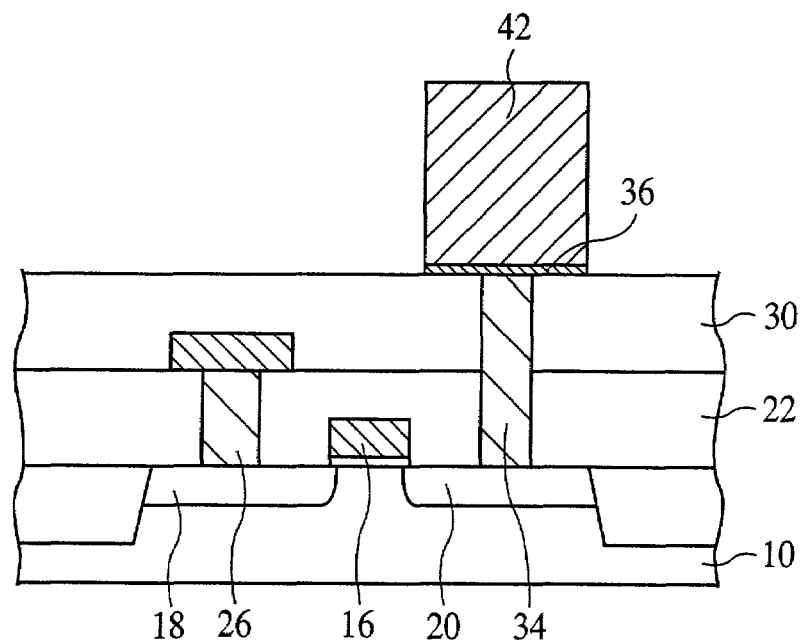
FIGS. 9A–9B are sectional views of the semiconductor device according to the second embodiment of the present invention in the steps of the method for fabricating the same, which show the method.
Figure 9B:
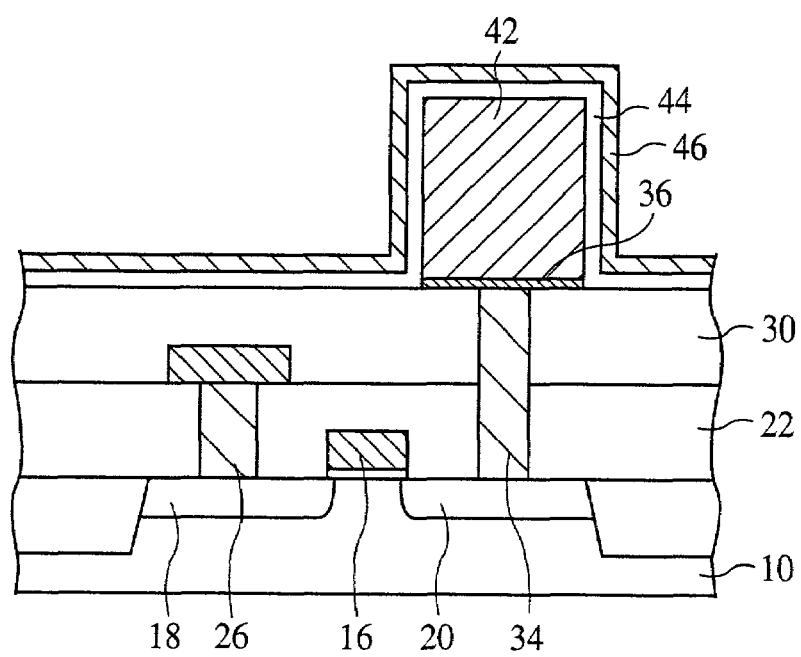

Then, the platinum film and the barrier metal layer 36 are patterned by lithography and etching to form the lower electrode 42 of the platinum film and connected to the source/drain diffused layer 20 via the barrier metal layer 36 and the plug 34 (FIG. 9A). The lower electrode 42 functions also as the buffer structure and has, e.g., an about 600 nm-height and an about 500 nm-width.

The lower electrode 42 of the present embodiment has, in addition to the ordinary function of a lower electrode, the function of preventing application of the stress from the silicon substrate 10 to the capacitor dielectric film 44, and at least a height of the lower electrode 42 is set to be larger than a width thereof along which the lower electrode 42 contacts the base. The lower electrode 42 also has the function of applying the compression stress to the capacitor dielectric film 44, and it is necessary that a material of the lower electrode 42 has a larger thermal expansion coefficient than that of a material forming the capacitor dielectric film 44.

Then, a 120 nm-thick PZT film is deposited on the lower electrode 42 at a temperature which is above a Curie point (Tc) by, e.g., CVD method to form the capacitor dielectric film 44 of a (001) oriented tetragonal PZT film.

Then, a 100 nm-thick platinum film is deposited on the entire surface by, e.g., CVD method to form the upper electrode 46 of the platinum film.

Thus, a ferroelectric memory device comprising one transistor and one capacitor and having polarization directions parallel with an electric field application direction.

As described above, according to the present embodiment, the lower electrode 42 provides the structure which functions also as the buffer structure for mitigating the influence of the stress from the silicon substrate 10, whereby even in a case that the substrate is formed of silicon, whose thermal expansion coefficient is smaller than that of the capacitor dielectric film 44, the (001) oriented capacitor dielectric film can be formed. Consequently, polarization directions of the capacitor dielectric film can be made parallel with a direction of an electric field applied between the upper electrode 46 and the lower electrode 42, which allows an intrinsic polarization of the ferroelectric film to be used as it is.

In the present embodiment, the platinum film to be the lower electrode 42, and the barrier metal layer 36 are patterned in the same configuration in the step shown in FIG. 9A, and then the capacitor dielectric film 44 is formed. However, the barrier metal 36 may be etched horizontally by a prescribed amount after the patterning and before the capacitor dielectric film 44 is formed.

Figure 10A:
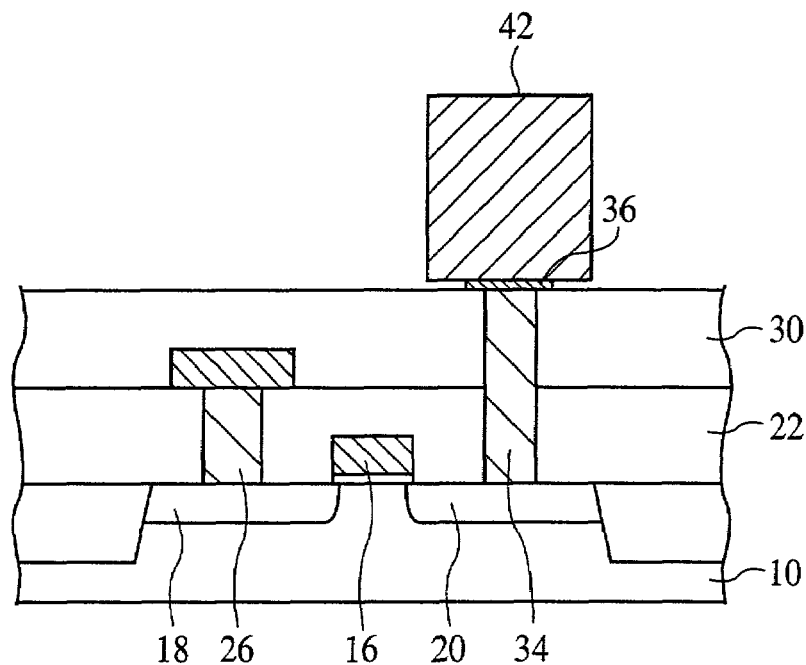
FIGS. 10A and 10B are diagrammatic sectional views of the semiconductor device according to a modification of the second embodiment of the present invention, which show a structure thereof.
Figure 10B:
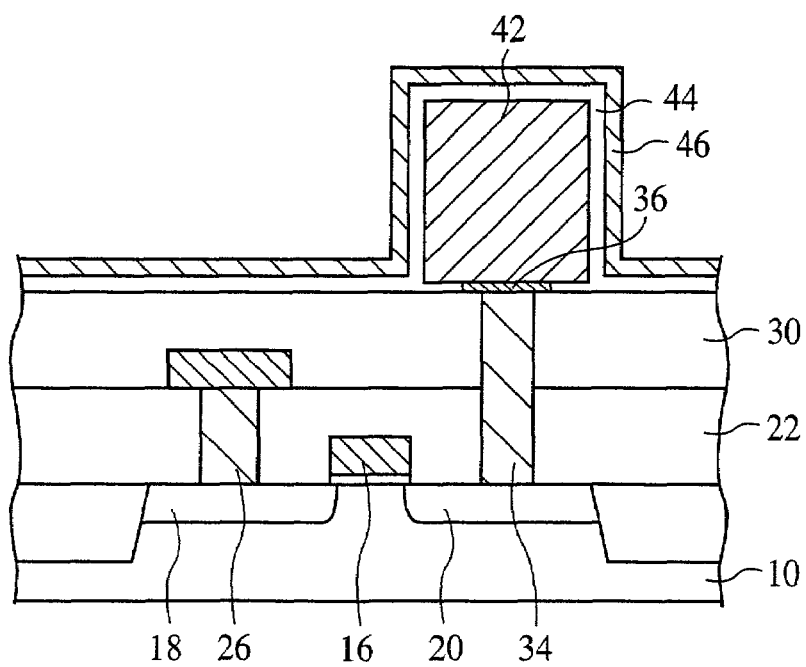

After the step shown in FIG. 9A, the barrier metal layer 36 is isotropically selectively etched by, e.g., an aqueous solution containing sulfuric acid and hydrogen peroxide to provide a gap between the lower electrode 42 and the inter-layer insulation film 30 as shown in FIG. 10A, whereby a contact area between the lower electrode 42 and the base structure can be much decreased. Consequently, the tensile stress applied to the capacitor dielectric film 44 from the silicon substrate 10 in the cooling process following the deposition of the capacitor dielectric film 44 can be further mitigated. In the case that the barrier metal layer 36 is horizontally etched, a device structure after the capacitor dielectric film 44 and the upper electrode 46 have been formed is as exemplified in FIG. 10B.

Characteristics of the capacitor dielectric film 44 are degraded, depending on a material of the barrier metal layer 36. From the viewpoint of preventing the characteristic degradation of the capacitor dielectric film 44, significantly the barrier metal layer 36 is horizontally etched.

[Third Embodiment]

The semiconductor device and the method for fabricating the same according to a third embodiment of the present invention will be explained with reference to FIGS. 11, 12A–12B, 13A–13B, and 14A–14B. The same members of the present embodiment as those of the semiconductor device and the method for fabricating the same according to the first and the second embodiments shown in FIGS. 2 to 10 are represented by the same reference numbers not to repeat or to simplify their explanation.

Figure 11:
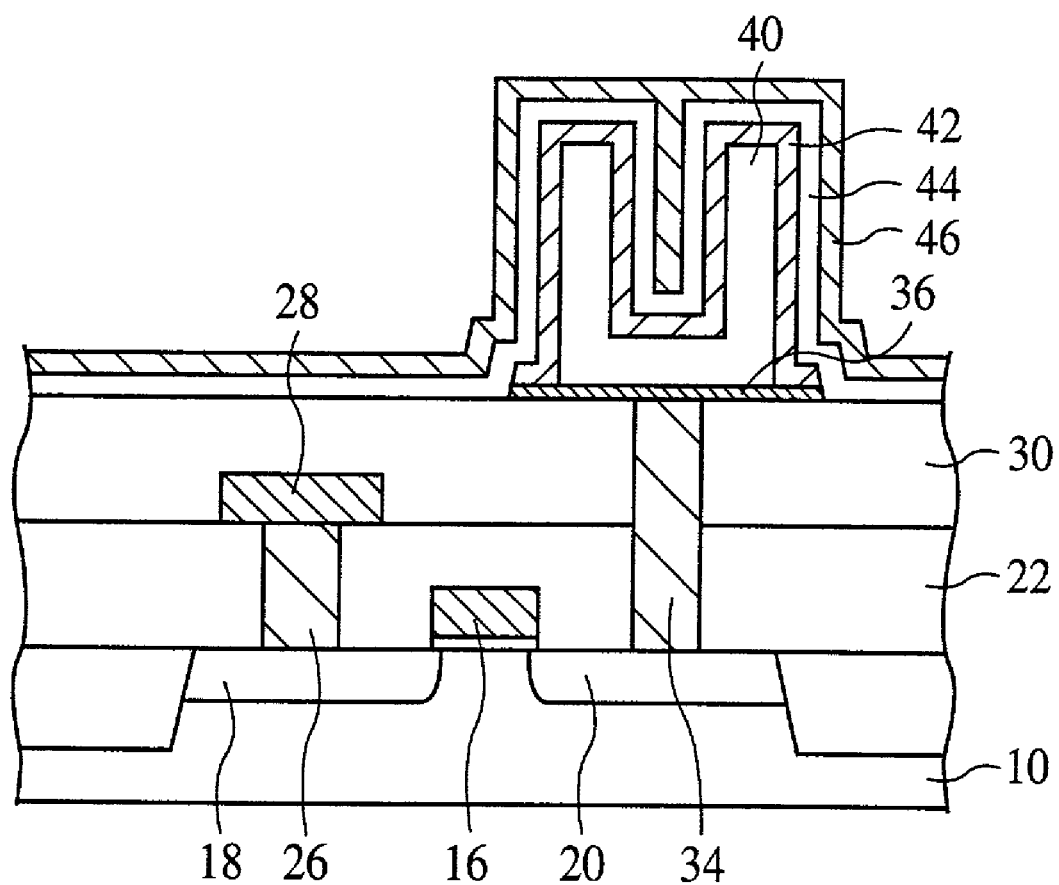
FIG. 11 is a diagrammatic sectional view of the semiconductor device according to a third embodiment of the present invention, which shows a structure thereof.

FIG. 11 is a diagrammatic sectional view of the semiconductor device according to the present embodiment, which shows a structure thereof. FIGS. 12A–12B, 13A–13B, and 14A–14B are sectional views of the semiconductor device according to the present embodiment in the steps of the method for fabricating the same, which show the method.

First, the structure of the semiconductor device according to the present embodiment will be explained with reference to FIG. 11.

As shown in FIG. 11, the semiconductor device according to the present embodiment is the same as the semiconductor device according to the first embodiment in that a buffer structure 40 is provided below a lower electrode 42. The semiconductor device according to the present embodiment is characterized mainly in that the buffer structure 40 is not the solid pillar-shaped body as shown in FIG. 2 but is a hollow pillar-shaped body. The semiconductor device has such constitution to thereby provide the same effects as those provided by the semiconductor device according to the first embodiment, and a capacitor area can be easily increased.

Then, the method for fabricating the semiconductor device according to the present embodiment will be explained with reference to FIGS. 12A–12B, 13A–13B, and 14A–14B.

First, in the same way as in the method for fabricating the semiconductor device according to the first embodiment shown in FIGS. 3A–3D, memory cell transistor, inter-layer insulation films 22, 30, contact hole 32, etc. are formed.

Then, an adhesion layer of a layer structure of titanium nitride/titanium, and a tungsten film are deposited by, e.g., sputtering method and then polished by CMP method until the surface of the inter-layer insulation film 30 is exposed. A plug 34 is thus formed, buried in the contact hole 32 and electrically connected to a source/drain diffused layer 20.

Then, a titanium nitride film is deposited by, e.g., sputtering method, on the inter-layer insulation film 30 with the plug 34 buried in to form a barrier metal layer 36 of the titanium nitride film.

Figure 12A:
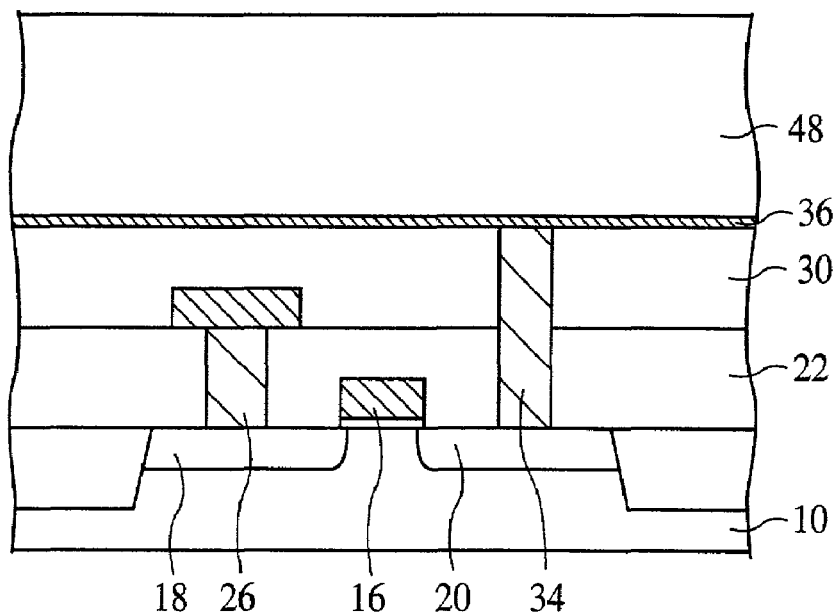
FIGS. 12A–12B, 13A–13B, and 14A–14B are sectional views of the semiconductor device according to the third embodiment of the present invention in the steps of the method for fabricating the same, which show the method.

Next, a 600 nm-thick silicon oxide film is deposited on the barrier metal layer by, e.g., CVD method to form an inter-layer insulation film 48 of the silicon oxide film (FIG. 12A).

Figure 12B:
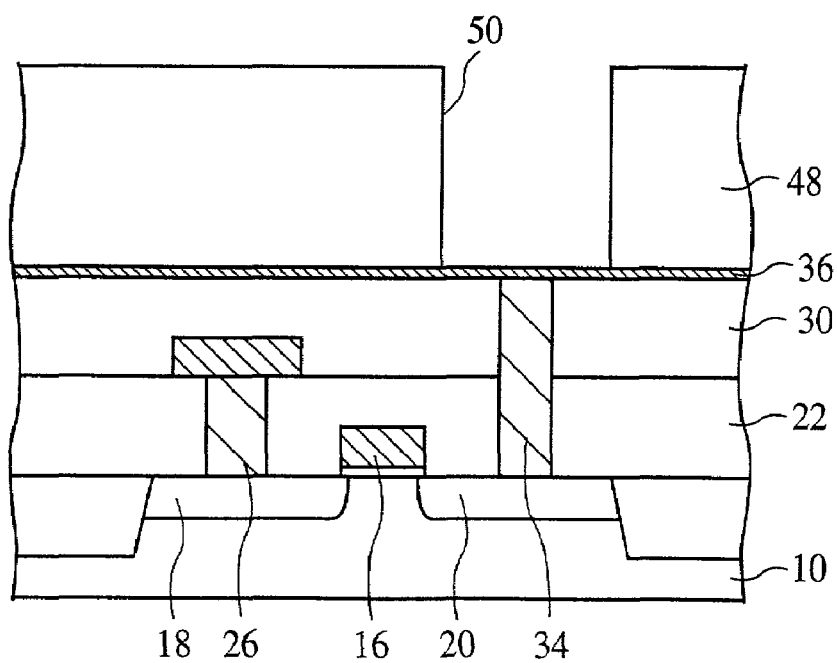

Then, the inter-layer insulation film is patterned by lithography and etching to form an opening 50 in the inter-layer insulation film 48 down to the barrier metal layer 36 (FIG. 12B).

Next, a 100 nm-thick (100) oriented MgO film is deposited by, e.g., reactive sputtering method.

Figure 13A:
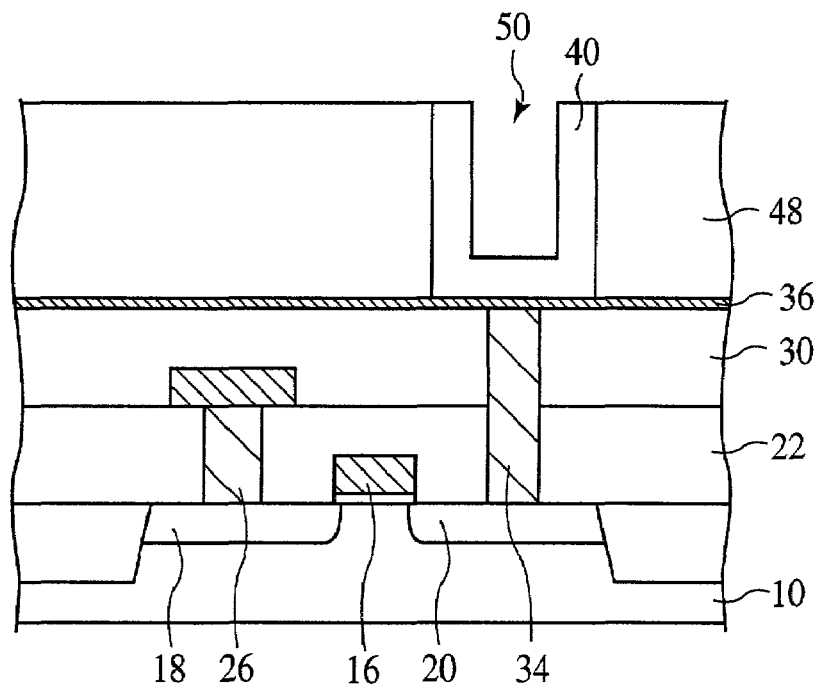

Then, the MgO film is evenly polished by, e.g., CMP method until the surface of the inter-layer insulation film 48 is exposed to remain selectively in the opening 50. The buffer structure 40 is thus formed of the MgO film and formed along the inside wall and the bottom of the opening 50 (FIG. 13A).

Figure 13B:
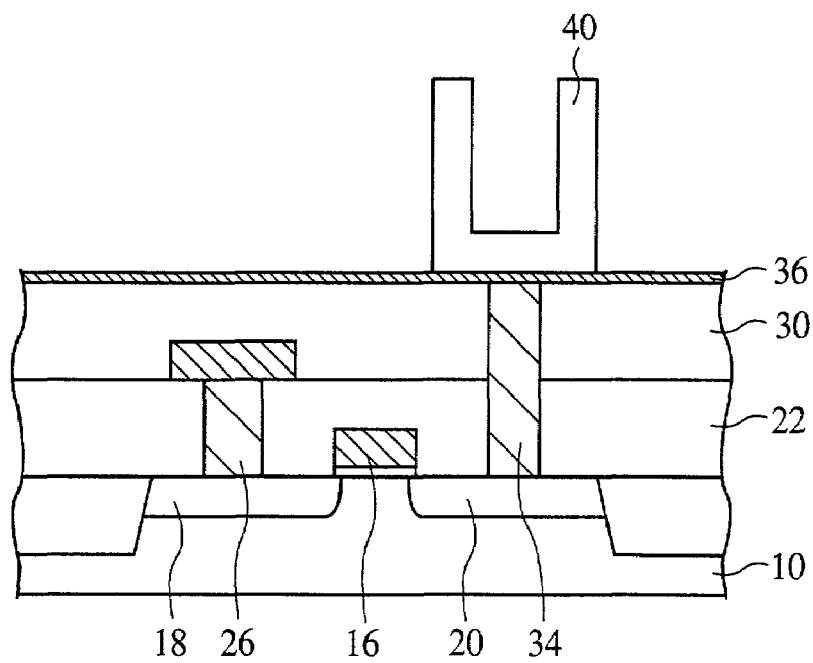

Then, the inter-layer insulation film 48 is selectively removed by wet-etching with, e.g., a hydrogen fluoride-based aqueous solution, using the barrier metal layer 36 as a stopper (FIG. 13B).

Next, a 60 nm-thick (100) oriented platinum film is deposited on the entire surface by, e.g., CVD method, which is good in step coverage.

Figure 14A:
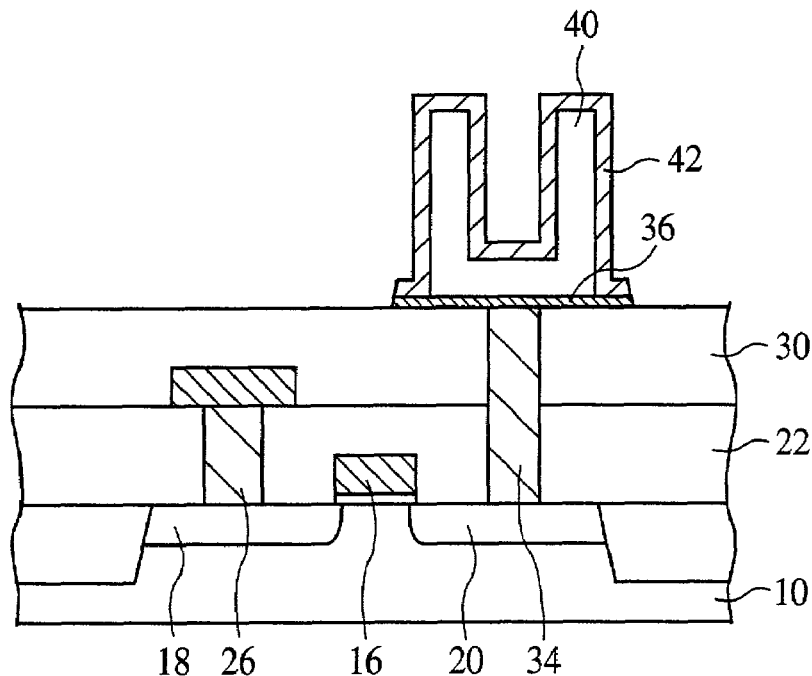

Then, the platinum film and the barrier metal layer 36 are patterned by lithography and etching to form a lower electrode 42 connected to the source/drain diffused layer 20 via the barrier metal layer 36 and the plug 34 (FIG. 14A).

Next, a 120 nm-thick PZT film is deposited on the lower electrode 42 by, e.g., a CVD method at a temperature above a Curie point (Tc) to form the capacitor dielectric film 44 of the (100) oriented cubic PZT film.

Figure 14B:
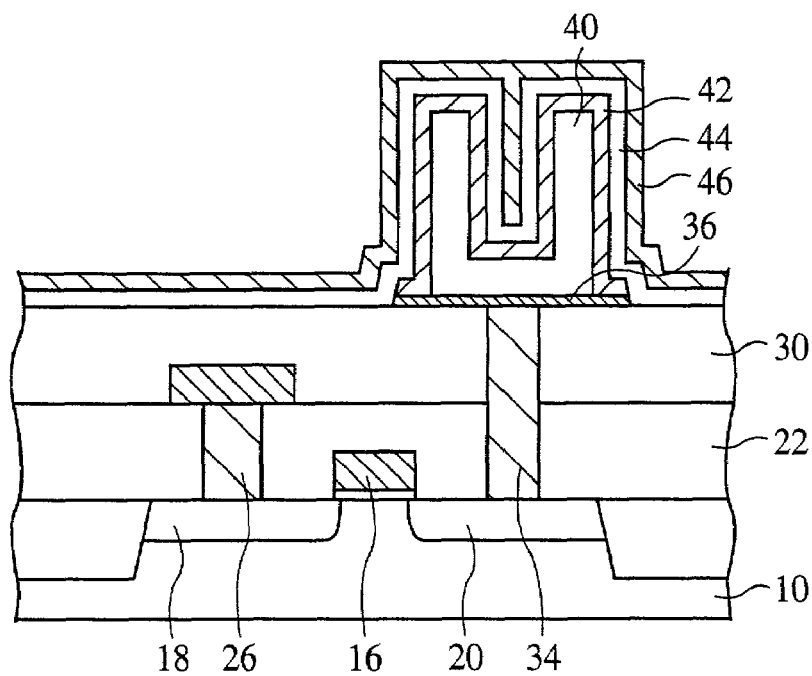

Then, a 100 nm-thick platinum film is deposited on the entire surface by, e.g., CVD method to form an upper electrode 46 of the platinum film (FIG. 14B).

Thus, a ferroelectric memory device comprising one transistor and one capacitor and having polarization directions of the capacitor dielectric film parallel with an electric field application direction can be fabricated.

As described above, according to the present embodiment, the buffer structure for mitigating the influence of the stress from the silicon substrate 10 is provided below the lower electrode 42, whereby even when the substrate is formed of silicon, whose thermal expansion coefficient is smaller than that of the capacitor dielectric film 44, the (001) oriented capacitor dielectric film can be formed. Consequently, polarization directions of the capacitor dielectric film can be made parallel with a direction of an electric field applied between the upper electrode 46 and the lower electrode 42, which permits an intrinsic polarization quantity of the ferroelectric film to be utilized as it is.

The buffer structure 40 has a hollow pillar-shaped, whereby the lower electrode 42 can have an increased surface area. Accordingly, the lower electrode having the same floor surface and height can ensure a larger capacitor area, which facilitates higher integration of the element.

[Fourth Embodiment]

The semiconductor device according to a fourth embodiment of the present invention and the method for fabricating the semiconductor device will be explained with reference to FIGS. 15, 16A–16C, 17A–17B, and 18A–18B. The same members of the present embodiment as those of the semiconductor device are represented by the same reference numbers not to repeat or to simplify their explanation.

Figure 15:
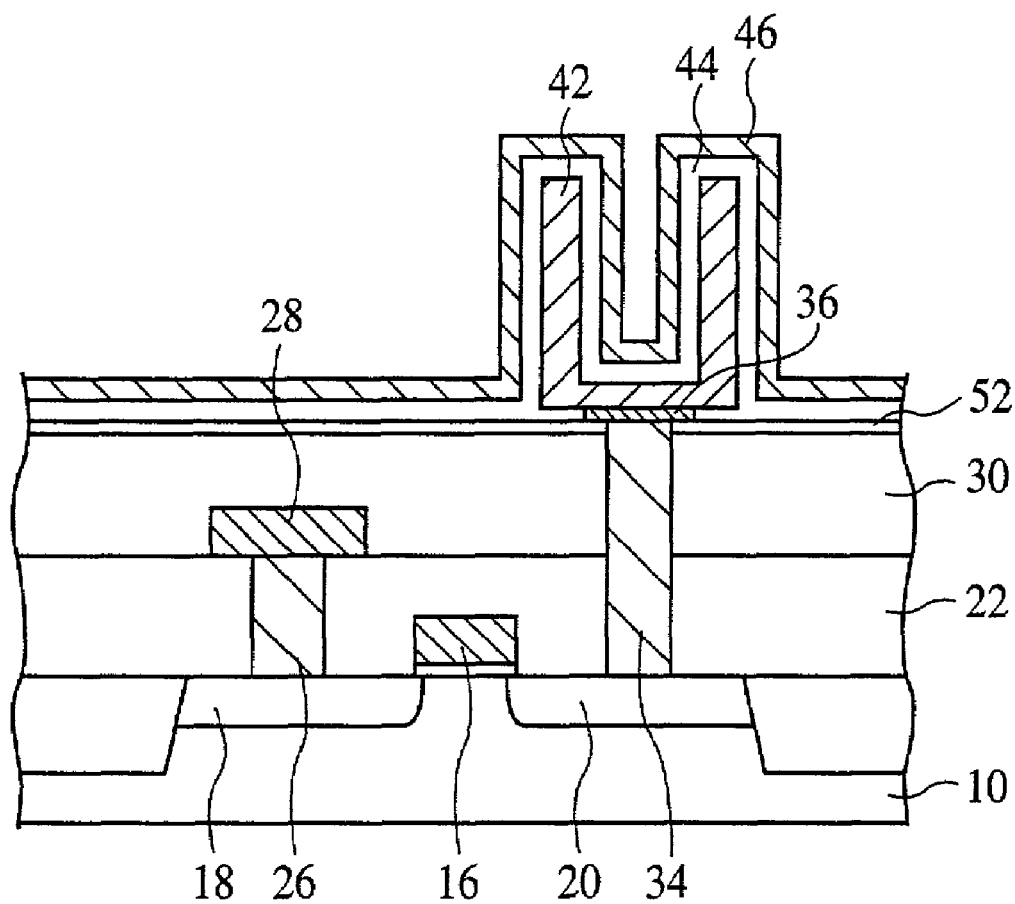
FIG. 15 is a diagrammatic sectional view of the semiconductor device according to a fourth embodiment of the present invention, which shows a structure thereof.

FIG. 15 is a diagrammatic sectional view of the semiconductor device according to the present embodiment, which shows a structure thereof. FIGS. 16A–16C, 17A–17B, and 18A–18B are sectional views of the semiconductor device according to the present embodiment in the steps of the method for fabricating the same, which show the method.

First, the structure of the semiconductor device according to the present embodiment will be explained with reference to FIG. 15.

The semiconductor device according to the present embodiment is the same as the semiconductor device according to the second embodiment in that, as shown in FIG. 15, a lower electrode 42 also functions as a buffer layer. The semiconductor device according to the present embodiment is characterized mainly in that the lower electrode 42 is not solid pillar-shaped as shown in FIG. 8 but is hollow-pillar-shaped. The semiconductor device having such constitution can produce the same effects as the semiconductor deice according to the second embodiment and can have an easily increased capacitor area.

Then, the method for fabricating the semiconductor device according to the present embodiment will be explained with reference to FIGS. 16A–16C, 17A–17B, and 18A–18B.

First, in the same way as, e.g., in the method for fabricating the semiconductor device according to the first embodiment shown in FIGS. 3A–3C, memory cell transistors, an inter-layer insulation film 22, etc. are formed.

Then, a silicon oxide film is deposited on the inter-layer insulation film 22 by, e.g., CVD method to form an inter-layer insulation film 30 of the silicon oxide film.

Next, a silicon nitride film is deposited on the inter-layer insulation film 30 by, e.g., CVD method to form an etching stopper film 52 of the silicon nitride film.

Figure 16A:
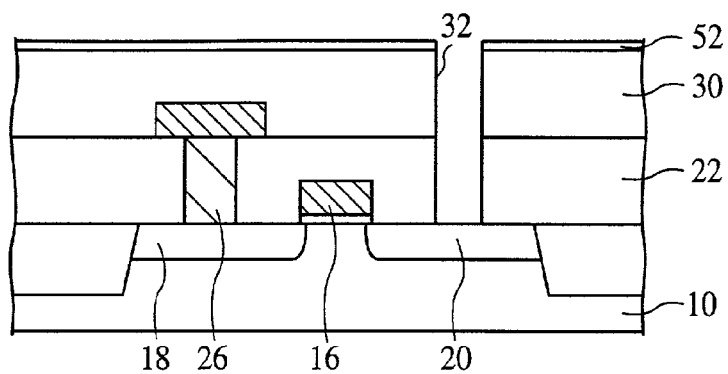
FIGS. 16A–16C, 17A–17B, and 18A–18B are sectional views of the semiconductor device according to the fourth embodiment of the present invention in the steps of the method for fabricating the same, which show the method.

Then, a contact hole 32 is formed in the etching stopper film 52 and the inter-layer insulation films 30, 22 down to a source/drain diffused layer 20 by lithography and etching (FIG. 16A).

Then, an adhesion layer of a layer structure of titanium nitride/titanium, and a tungsten film are deposited and the polished by CMP method until the surface of the inter-layer insulation film 30 is exposed. Thus, a plug 34 is formed, buried in the contact hole 32 and electrically connected to the source/drain diffused layer 20.

Figure 16B:
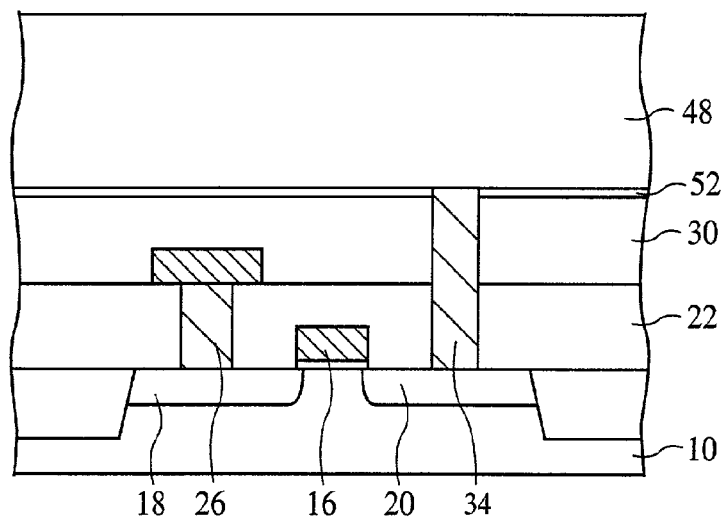

Next, a 600 nm-thick silicon oxide film is deposited on the etching stopper film 52 by, e.g., CVD method to form an inter-layer insulation film 48 of the silicon oxide film (FIG. 16B).

Figure 16C:
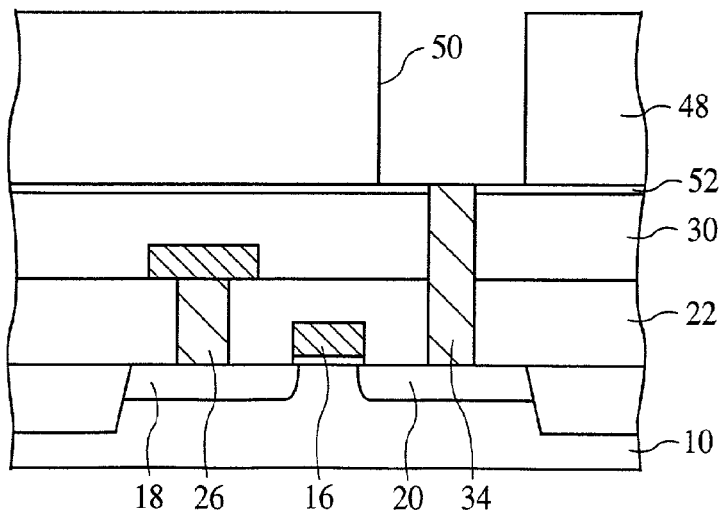

Then, the inter-layer insulation film 48 is patterned by lithography and etching to form in the inter-layer insulation film 48 an opening 50 which reaches the etching stopper film 52 and exposes the plug 34 (FIG. 16C).

Next, a titanium nitride film is deposited by, e.g., sputtering method to form a barrier metal layer 36 of the titanium nitride film.

Then, a 100 nm-thick (100) oriented platinum film is deposited on the barrier metal layer 36 by, e.g., CVD method, which is good in step coverage.

Figure 17A:
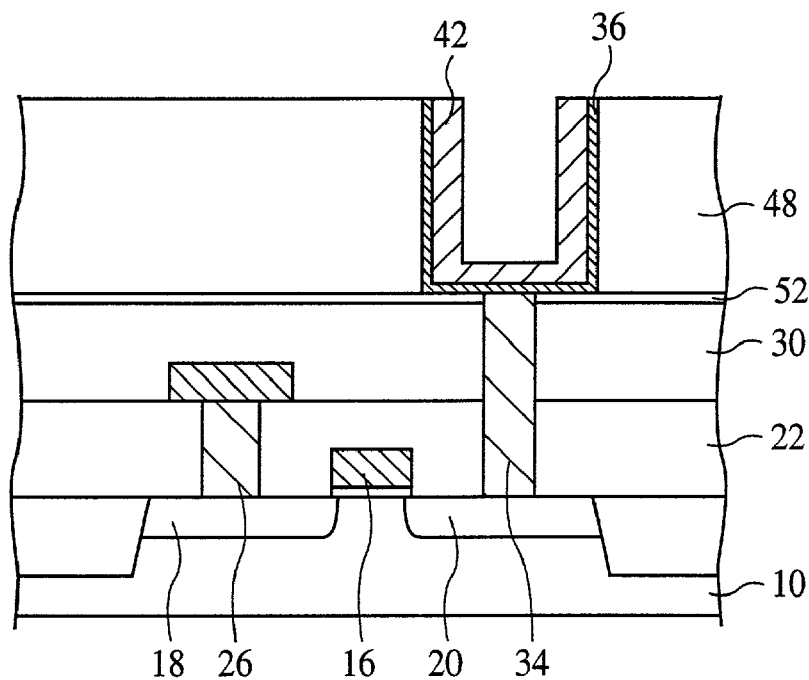

Then, the platinum film and the barrier metal layer 36 are evenly polished by, e.g., CMP method until the surface of the inter-layer insulation film 48 is exposed, to leave the platinum film and the barrier metal layer 36 selectively in the opening 50. Thus, the lower electrode 42 is formed along the inside wall and the bottom of the opening 50, electrically connected to the source/drain diffused layer 20 via the barrier metal layer 36 and the plug 34 (FIG. 17A).

Figure 17B:
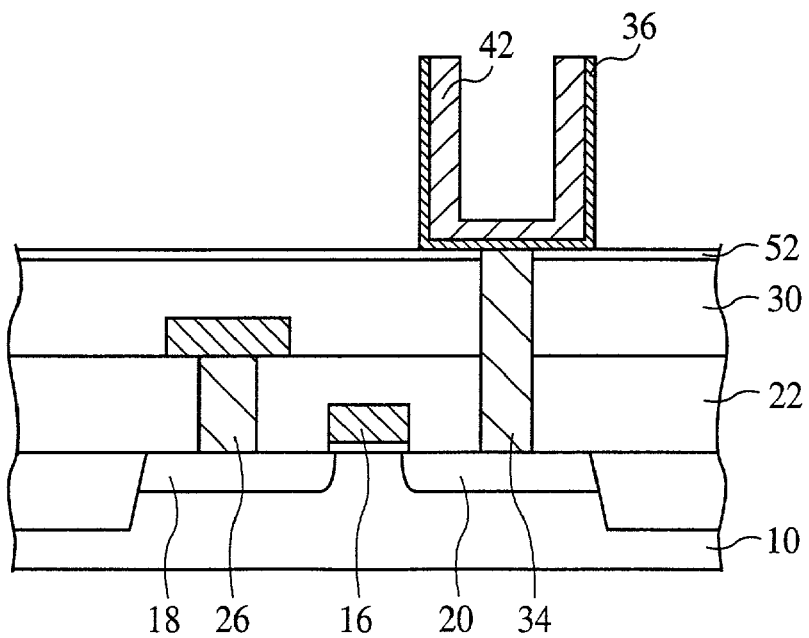

Then, the inter-layer insulation film 48 is selectively removed by wet-etching with, e.g., a hydrogen fluoride-based aqueous solution, using the etching stopper film 52 as a stopper (FIG. 17B).

Figure 18A:
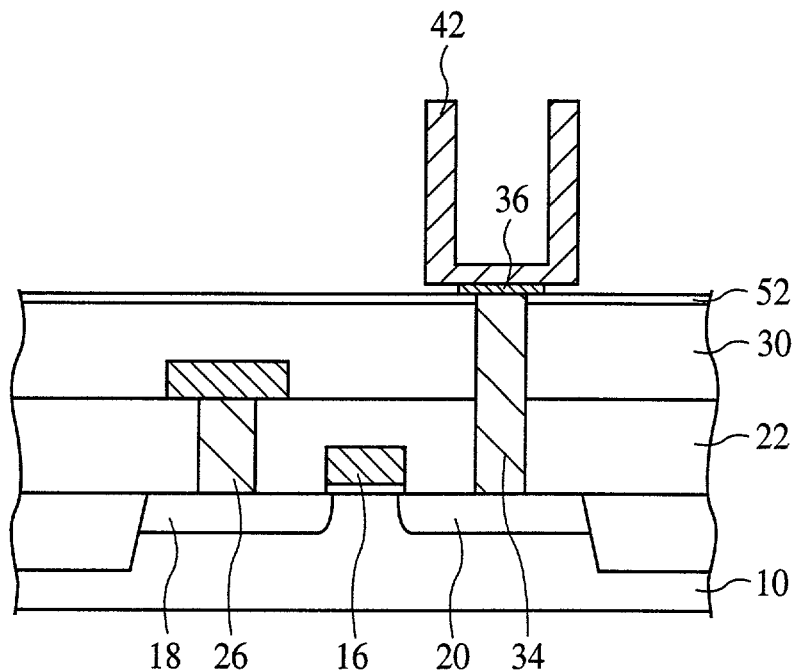

Next, the barrier metal layer 36 is selectively etched with the etching stopper film 52 as a stopper by wet-etching using, e.g., an aqueous solution containing sulfuric acid and hydrogen peroxide (FIG. 18A). In this etching, the barrier metal layer 36 is etched until a gap is formed between the lower electrode 42 and the inter-layer insulation film 30, whereby a contact area between the lower electrode 42 and the base structure can be much smaller, whereby the stress applied to the capacitor dielectric film 44 from the silicon substrate 10 in the cooling processing following the deposition of the capacitor dielectric film 44 can be further mitigated.

Next, a 120 nm-thick PZT film is deposited on the lower electrode 42 at a temperature above Curie point (Tc) by, e.g., CVD method to form the capacitor dielectric film 44 of the (001) oriented tetragonal PZT film.

Figure 18B:
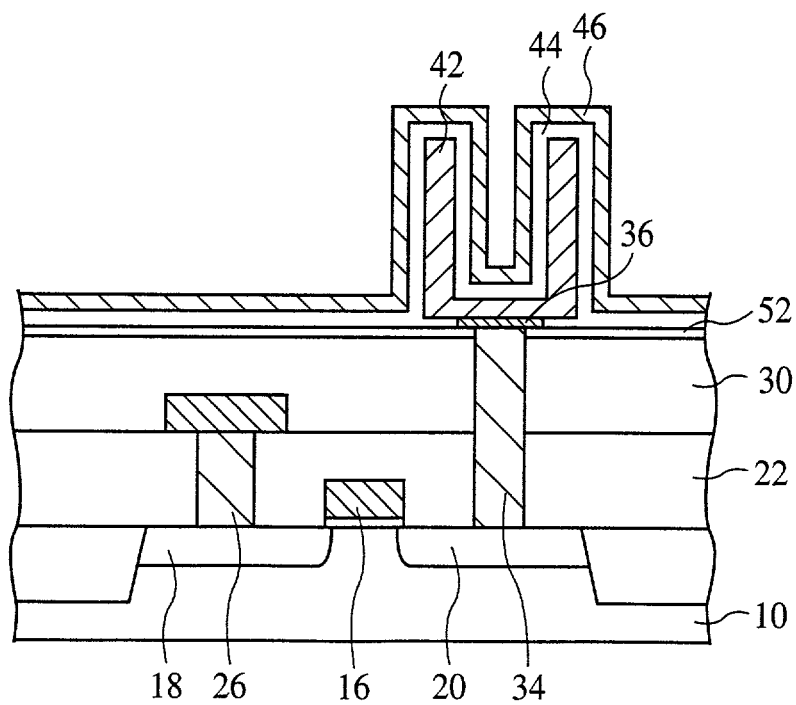
Figure 19A:
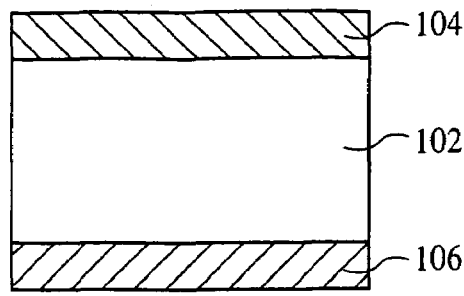
FIGS. 19A–19C are diagrammatic sectional views of the conventional semiconductor device, which show the structures and problems thereof.
Figure 19B:
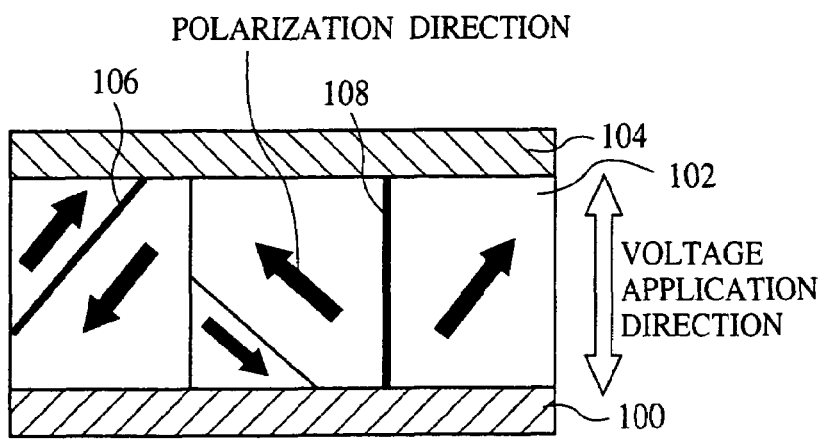
Figure 19C:
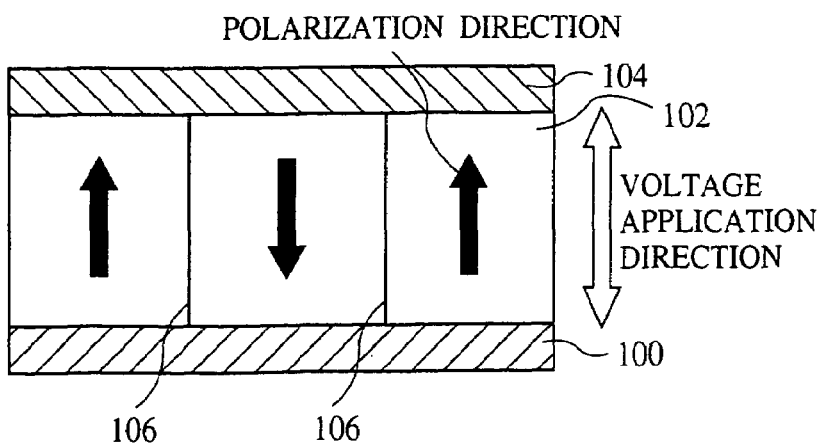
Figure 20:
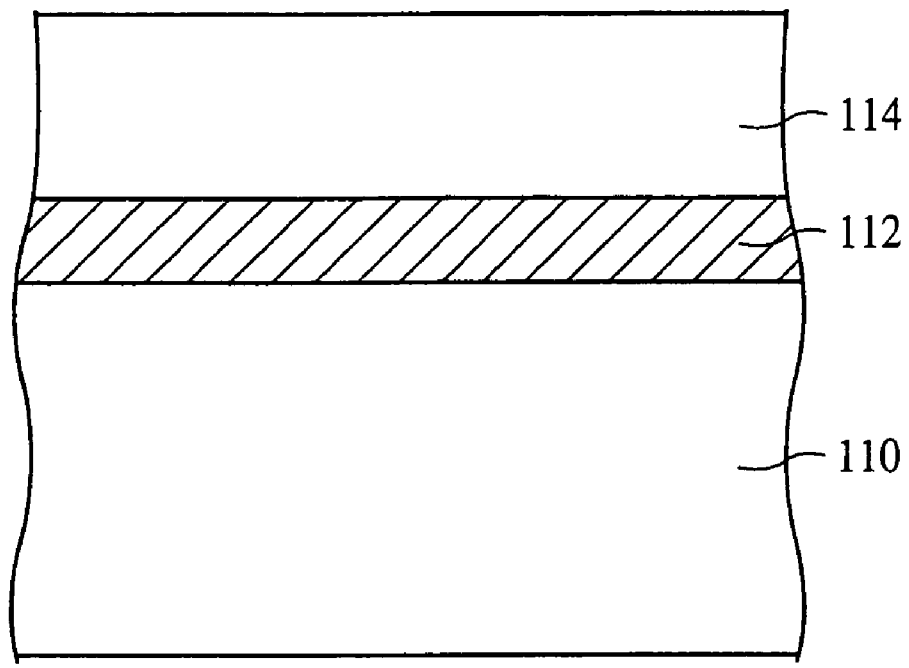
FIG. 20 is a diagrammatic sectional view showing the conventional method for forming (001) oriented PZT film.
Figure 21:
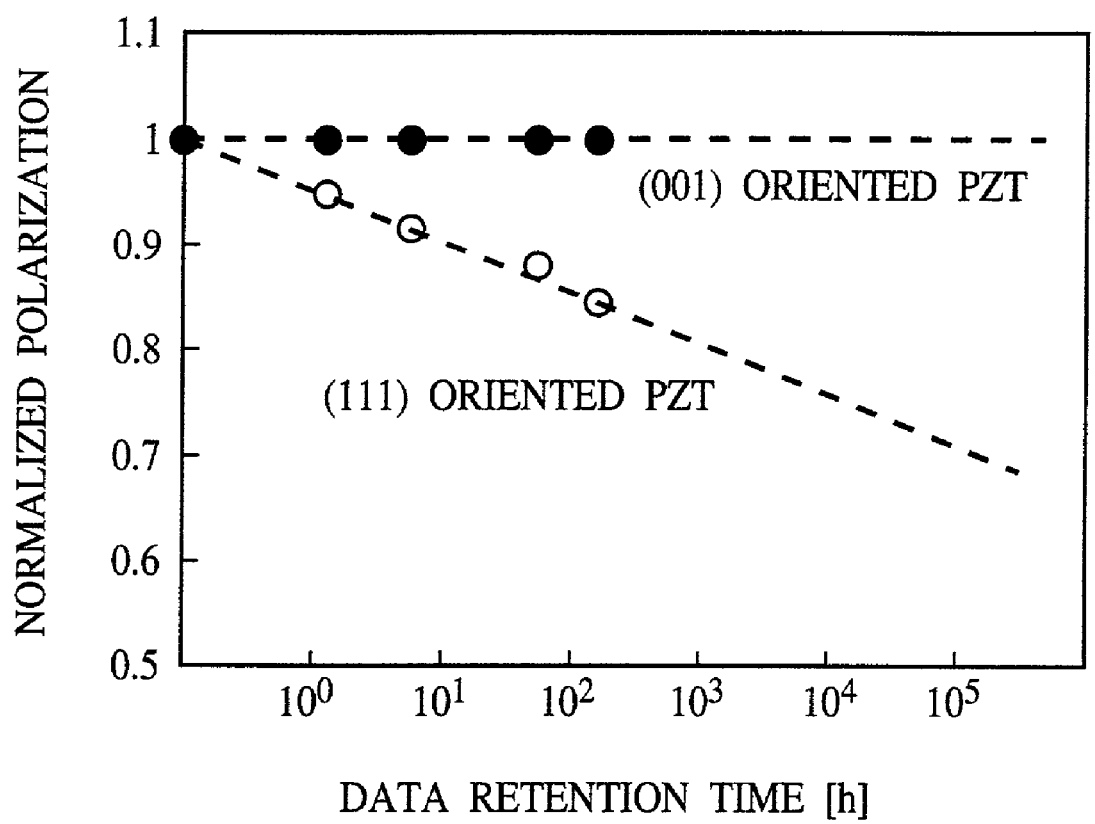
FIG. 21 is a graph of data retention time of the nonvolatile memory device using (001) oriented PZT film and the nonvolatile memory device using (111) oriented PZT film.

Then, a 100 nm-thick platinum film is deposited on the entire surface by, e.g., CVD method to form the upper electrode 46 of the platinum film (FIG. 18B).

Thus, a ferroelectric memory device including one transistor and one capacitor, and the capacitor dielectric film whose polarization directions are parallel with an electric field application direction can be fabricated.

As described above, according to the present embodiment, the lower electrode 42 provides the structure which functions also as the buffer structure for mitigating the influence of the stress from the silicon substrate 10, whereby even in a case that the substrate is formed of silicon, whose thermal expansion coefficient is smaller than the capacitor dielectric film 44, the capacitor dielectric film can be (001) oriented. Consequently, polarization directions of the capacitor dielectric film can be parallel with a direction of an electric field applied between the upper electrode 46 and the lower electrode 42, whereby an intrinsic polarization quantity of the ferroelectric film can be utilized as it is.

The lower electrode 42 has a hollow pillar-shaped, whereby the lower electrode 42 can have an increased surface area. Accordingly, the lower electrode having the same floor surface and height can ensure a larger capacitor area, which facilitates higher integration of the element.

[Modifications]

The present invention is not limited to the above-described embodiments and can cover other various modifications.

For example, in the above-described embodiments, the lower electrode 42 is formed of (100) oriented platinum film, and the capacitor dielectric film 44 is formed of (001) oriented tetragonal PZT film, but the lower electrode 42 may be formed of (111) oriented platinum film, and the capacitor dielectric film 44 is formed of (111) oriented rhombohedral PZT film. In the case where (111) oriented rhombohedral PZT film is used, polarization directions of the capacitor dielectric film 44 are parallel with a direction of an electric field applied between the upper electrode 46 and the lower electrode 42, whereby an intrinsic polarization of the ferroelectric film can be utilized as it is.

(111) oriented platinum film can be deposited by, e.g., a solution evaporation-type CVD method without oxygen introduced.

(111) oriented rhombohedral PZT film can be formed by, e.g., a solution evaporation-type CVD method in which raw material flow rates are controlled so that a Zr/Ti ratio is, e.g., 60/40. When PZT film is deposited at this ratio, the PZT film tends to be (111) oriented cubic system. (111) oriented PZT film undergoes phase transition from cubic system to rhombohedral system while being cooled from an above Curie temperature to the room temperature. In the phase transition, the PZT film is subjected to uniform compression stress from the buffer layer to be (111) oriented rhombohedral PZT film.

A material of the lower electrode 42 and a material of capacitor dielectric film 44 are not limited to platinum film and PZT film.

The present invention can be widely used in applications of ferroelectric films of perovskite structure to capacitor dielectric films. The present invention can produce the same effect on SrTiO₃ film, Bi₂SrTaO₉ film, etc. in addition to PZT film.

It is preferable that materials of the lower electrode 42 and the upper electrode 46 are suitably selected in compatibility with the capacitor dielectric film 44. In cases that SrTiO₃ film, Bi₂SrTaO₉ film are used, electrode materials can be platinum, ruthenium, ruthenium oxide, tungsten, SRO (SrRuO₃), etc. can be used.

In the case that the lower electrode 42 is used also as the buffer structure, conductive materials having large thermal expansion coefficients than the capacitor dielectric film 44, e.g., platinum, silver (Ag), gold (Au), chrome (Cr), copper (Cu), iridium (Ir), nickel (Ni), tantalum (Ta), titanium (Ti), etc. can be used.

In the first and the third embodiments, the buffer structure 40 is formed of MgO film but is not essentially formed of MgO film. The buffer structure 40 may be formed of a material other than MgO as long as the material has a larger thermal expansion coefficient than the capacitor dielectric film 44. MgAl₂O₄, CaO, ZrO₂, Y₂O₃, etc. can be used.

The buffer structure 40 is not essentially formed of such insulating materials. The buffer structure 40 may be formed of the above-described platinum, silver, gold, chrome, iridium, nickel, tantalum, etc., and in these cases the lower electrode 42 and the barrier metal layer 36 may not be contacted directly to each other as exemplified in FIGS. 2 and 11, because the lower electrode 42 and the barrier metal 36 are contacted to each other by the buffer structure 40.

In the above-described embodiments, the ferroelectric capacitor is applied to semiconductor devices, and the ferroelectric capacitor is formed on a silicon substrate. However, the present invention can produce conspicuous effects in cases that the ferroelectric capacitor according to the present invention is formed on substrates having thermal expansion coefficients smaller than that of the ferroelectric film. In cases that the ferroelectric film is formed on substrates having larger thermal expansion coefficients than that of the ferroelectric film, it will not prevent the present invention from producing the effects of the present invention. Accordingly, the substrate is not limited to silicon, and the present invention is applicable to cases that the ferroelectric capacitor is formed on binary compound substrates as of GaAs substrate, etc., oxide substrates, such as MgO substrates, SrTiO₃ substrates, LaAlO₃ substrates, etc.

What is claimed is:

1. A capacitor comprising:
a buffer structure of an insulating material formed over a substrate;
a lower electrode formed over the buffer structure;
a capacitor dielectric film formed on the lower electrode, and formed of a perovskite ferroelectric material having a smaller thermal expansion coefficient than that of the buffer structure and having a crystal oriented substantially perpendicular to a surface of the lower electrode; and
an upper electrode formed on the capacitor dielectric film,
the buffer structure having a height larger than a width thereof so as to suppress a stress applied to the capacitor dielectric film caused by a thermal expansion coefficient difference between the substrate and the capacitor dielectric film.

2. A capacitor according to claim 1, wherein a thermal expansion coefficient of the capacitor dielectric film is larger than that of the substrate.

3. A capacitor according to claim 1, wherein the capacitor dielectric film has (001) oriented tetragonal crystal structure.

4. A capacitor according to claim 3, wherein the lower electrode has (100) oriented cubic crystal structure.

5. A capacitor according to claim 1, wherein the capacitor dielectric film has (111) oriented rhombohedral crystal structure.

6. A capacitor according to claim 5, wherein the lower electrode has (111) oriented cubic crystal structure.

7. A capacitor according to claim 1, wherein the capacitor dielectric film is formed by CVD method.

8. A capacitor according to claim 2, wherein the capacitor dielectric film is formed by CVD method.

9. A semiconductor device comprising:
a memory cell transistor formed on a semiconductor substrate, and including a gate electrode, and source/drain diffused layers formed in the semiconductor substrate respectively on both sides of the gate electrode;
an insulation film covering the semiconductor substrate with the memory cell transistor formed on;
a buffer structure of an insulating material formed on the insulation film; and
a capacitor formed over the buffer structure, and including a lower electrode electrically connected to one of the source/drain diffused layers; a capacitor dielectric film formed on the lower electrode, and formed of a perovskite ferroelectric material having a smaller thermal expansion coefficient than that of the buffer structure and having a crystal oriented substantially perpendicular to a surface of the lower electrode; and an upper electrode formed on the capacitor dielectric film,
the buffer structure having a height larger than a width thereof so as to suppress a stress applied to the capacitor dielectric film caused by a thermal expansion coefficient difference between the substrate and the capacitor dielectric film.

10. A semiconductor device comprising:
a memory cell transistor formed on a semiconductor substrate and including a gate electrode, and source/drain diffused layers formed in the semiconductor substrate respectively on both sides of the gate electrode;
an insulation film covering the semiconductor substrate with the memory cell transistor formed on;
a contact plug buried in the insulation film and electrically connected to one of the source/drain diffused layers;
a barrier metal layer formed on the contact plug and the insulation film; and
a capacitor formed over the insulation film, and including a lower electrode formed on the barrier metal layer and having a width larger than that of the barrier metal layer;
a capacitor dielectric film formed on the lower electrode, and formed of a perovskite ferroelectric material having a larger thermal expansion coefficient than that of the semiconductor substrate and having a crystal oriented substantially perpendicular to a surface of the lower electrode; and
an upper electrode formed on the capacitor dielectric film,
the lower electrode having a height larger than a width thereof and being not in contact with the insulation film so as to suppress a stress applied to the capacitor dielectric film caused by a thermal expansion coefficient difference between the substrate and the capacitor dielectric film.

* * * * *